US012700443B2

(12) United States Patent
Saenz et al.

(10) Patent No.: US 12,700,443 B2
(45) Date of Patent: Aug. 4, 2026

(54) CIRCUIT SNAPBACK AND CHARGE DIVERSION FOR CROSS-POINT ARRAYS

(71) Applicant: Sandisk Technologies, Inc., Milpitas, CA (US)

(72) Inventors: Juan P. Saenz, Menlo Park, CA (US); Mark Lin, Santa Clara, CA (US); Christopher J. Petti, Mountain View, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 86 days.

(21) Appl. No.: 18/747,626

(22) Filed: Jun. 19, 2024

(65) Prior Publication Data

US 2025/0391455 A1      Dec. 25, 2025

(51) Int. Cl.
G11C 11/16            (2006.01)

(52) U.S. Cl.
CPC ........ G11C 11/1673 (2013.01); G11C 11/161 (2013.01); G11C 11/1659 (2013.01); G11C 11/1697 (2013.01)

(58) Field of Classification Search
CPC .............. G11C 11/1673; G11C 11/161; G11C 11/1659; G11C 11/1697
See application file for complete search history.

(56) References Cited

U.S. PATENT DOCUMENTS

| | | |
|---|---|---|
| 1,173,559 A | 2/1916 | Chollet |
| 9,123,410 B2 | 9/2015 | Castro et al. |
| 10,553,647 B2 * | 2/2020 | Grobis ................ G11C 11/1673 |
| 10,861,505 B2 | 12/2020 | Kang et al. |
| 11,087,854 B1 | 8/2021 | Mantegazza |
| 2016/0372193 A1 | 12/2016 | Kripanidhi et al. |
| 2020/0006432 A1 | 1/2020 | Grobis et al. |
| 2022/0139454 A1 | 5/2022 | Robertson et al. |

FOREIGN PATENT DOCUMENTS

| | | |
|---|---|---|
| TW | 202335255 A | 9/2023 |

OTHER PUBLICATIONS

No, Taeung, et al., "A Discharge-Path-Based Sensing Circuit with OTS Snapback Current Protection for Phase Change Memories," IEEE Access, May 2022, 9 pages.
International Search Report & The Written Opinion of the International Searching Authority dated May 19, 2025, International Application No. PCT/US2025/011259].

* cited by examiner

*Primary Examiner* — Xiaochun L Chen
(74) *Attorney, Agent, or Firm* — Pearl Cohen Zedek Latzer Baratz LLP

(57)            ABSTRACT

Technology for reading memory cells in a cross-point memory array. Each memory cell may have a threshold switching selector in series with a programmable resistance memory element. The memory system has control circuitry adjacent to the cross-bar memory array that is used to generate and deliver currents to the cross-bar memory array. The memory system temporarily provides capacitive isolation of the selected memory cell from capacitance of the adjacent circuitry while the snapback current is present. The memory system provides a discharge path to a node between the control circuitry and the selected memory cell during a period in which the capacitive isolation is removed.

20 Claims, 20 Drawing Sheets

1000

Provide read current to selected word line connected to selected memory cell — 1002

Provide capacitive isolation for the selected memory cell from circuit capacitance — 1004

Provide capacitive discharge path in preparation for removing capacitive isolation — 1006

Remove the capacitive isolation — 1008

Remove the capacitive discharge path — 1010

Sense the memory cell — 1012

<u>1000</u>

<u>1500</u>

CIRCUIT SNAPBACK AND CHARGE DIVERSION FOR CROSS-POINT ARRAYS

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when the non-volatile memory is not connected to a source of power (e.g., a battery). Non-volatile memory can be made to appear non-volatile at least for a limited time by, external to the memory chip, adding battery back to the power supply.

The memory cells may reside in a cross-point memory array. In a memory array with a cross-point type architecture, one set of conductive lines run across the surface of a substrate and another set of conductive lines are formed above the other set of conductive lines running in an orthogonal direction relative to the initial layer. The memory cells are located at the cross-point junctions of the two sets of conductive lines. Cross-point memory arrays are sometimes referred to as cross-bar memory arrays.

A programmable resistance memory cell is formed from a material having a programmable resistance. In a binary approach, the programmable resistance memory cell can be programmed into one of two resistance states: high resistance state (HRS) and low resistance state (LRS). In some approaches, more than two resistance states may be used. One type of programmable resistance memory cell is a magnetoresistive random access memory (MRAM) cell. An MRAM cell uses magnetization to represent stored data, in contrast to some other memory technologies that use electronic charges (DRAM) or voltages (SRAM) to store data. A bit of data is written to an MRAM cell by changing the direction of magnetization of a magnetic element ("the free layer") within the MRAM cell, and a bit is read by measuring the resistance of the MRAM cell, such resistance changing with the direction of magnetization. However, the cross-point memory array may have other types of memory cells. For example, the cross-point memory array may have memory cell of other technologies such as ReRam, PCM (Phase Change Memory), or FeRam.

In a cross-point memory array, each memory cell may contain a threshold switching selector in series with the material having the programmable resistance. The threshold switching selector has a high resistance (in an off or non-conductive state) until it is biased to a voltage higher than its threshold voltage (Vt) or current above its threshold current, (It), and until its voltage bias falls below Vhold ("Voffset") or current below a holding current Ihold. After the Vt is exceeded and while Vhold is exceeded across the threshold switching selector, the threshold switching selector has a relatively lower resistance (in an on or conductive state). The threshold switching selector remains on until its current is lowered below a holding current Ihold, or the voltage is lowered below a holding voltage, Vhold. When this occurs, the threshold switching selector returns to the off (higher) resistance state. To read a memory cell, the threshold switching selector is activated by being turned on before the resistance state of the memory cell is determined. One example of a threshold switching selector is an Ovonic Threshold Switch (OTS). Other examples of threshold switching selectors include, but are not limited to, Volatile Conductive Bridge (VCB), Metal-Insulator-Metal (MIM), or other material that provides a highly non-linear dependence of current on select voltage.

A forced current technique can be used for reading or writing a programmable resistance memory cell in a cross-point array whereby a current is driven to the memory cell that is address selected for read or write ("selected memory cell"). The cross-point array is composed of orthogonal wire sets in two or more planes. For example, a current is driven to a selected wire in the X direction while a voltage is applied to selected wire in the Y direction. The current will charge up the voltage across the selected memory cell until the threshold switching selector turns on. Then, while the current is driven through the programmable resistance memory element of the selected memory cell, the voltage across the selected cell is sensed.

The switching on of a threshold switching selector can result in a snapback current. Specifically, the voltage across the memory cell drops rapidly after the threshold switching selector turns on, resulting in a snapback current. This snapback current can flow through the programmable resistance memory element, which could potentially change the state of the programmable resistance memory element prior to sensing the memory element bit state; e.g., a read disturb that results in a miss-read. Thus, programmable resistance memory elements such as, but not limited to MRAM elements, could inadvertently and undesirably have their state changed due to snapback currents that flow through the memory elements during the read operation.

BRIEF DESCRIPTION OF THE DRAWINGS

Like-numbered elements refer to common components in the different figures.

DETAILED DESCRIPTION

Figure 1:
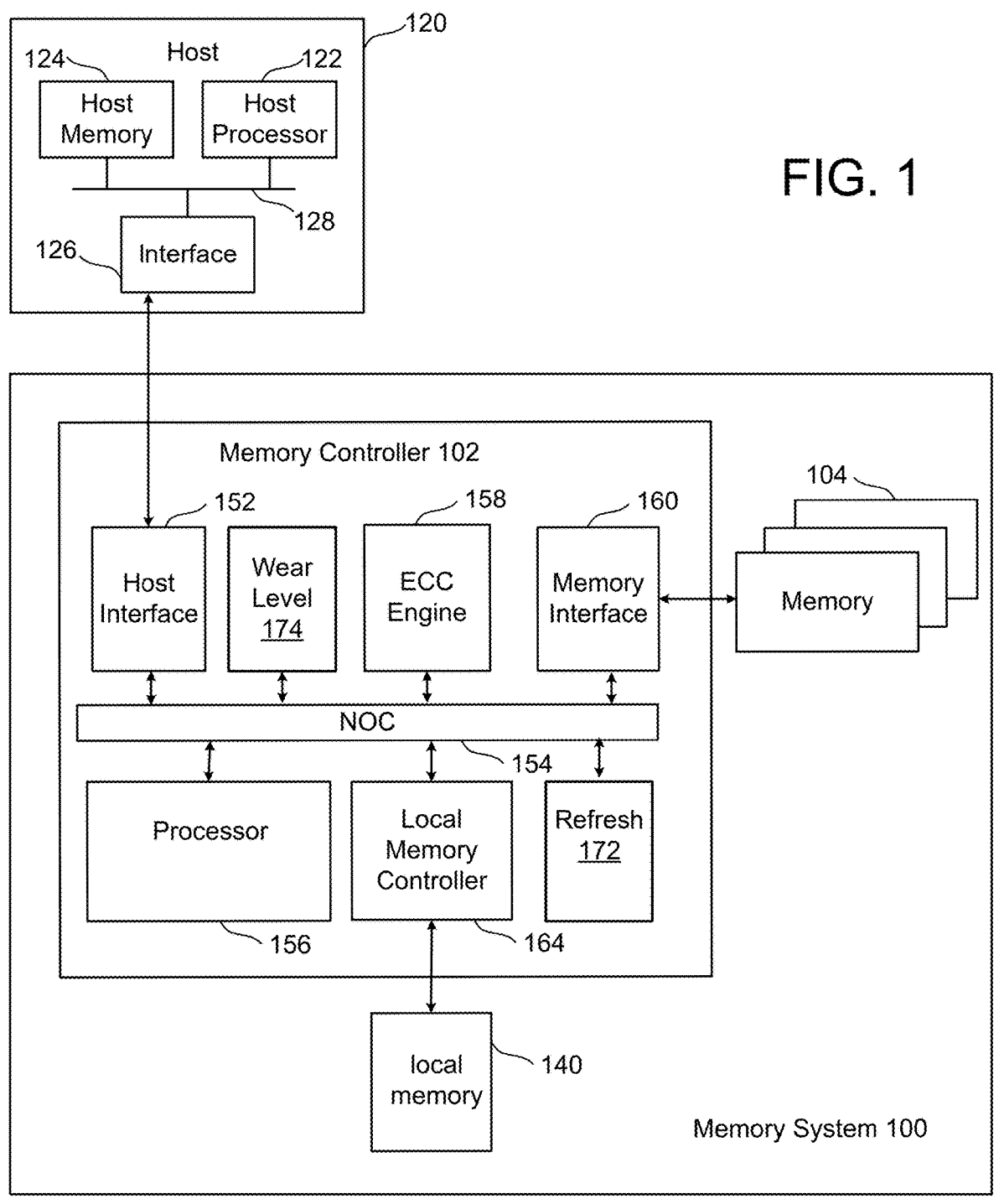
FIG. 1 is a block diagram of one embodiment of a non-volatile memory system connected to a host.

Technology is disclosed for a memory system and method for reading programmable resistance memory cells in a cross-bar memory array. Each memory cell may have a threshold switching selector in series with a programmable resistance memory element. The memory system has control circuitry adjacent to the cross-bar memory array that is used to generate and deliver currents to the cross-bar memory array. The capacitance associated with this control circuitry can impact the magnitude of a snapback current that results when the threshold switching selector switches on. The memory system temporarily provides capacitive isolation of the selected memory cell from this circuit capacitance while the snapback current is present. In one technique the memory system temporarily increases resistance of one or more decode transistors that select the word line, which provides capacitive isolation. However, to read the memory cell the resistance of the one or more decode transistors should be low. Therefore, the capacitive isolation is removed prior to reading the cell by changing the resistance of the one or more decode transistors to a higher resistance. This higher resistance provides for a better signal-to-noise ratio when sensing the memory cell. However, the removal of the capacitive isolation may itself result in a snapback current that could inadvertently flip the state of the memory cell. An embodiment of the memory system provides a discharge path to a node between the control circuitry and the selected memory cell during a period in which the capacitive isolation is removed. This discharge path prevents a current that may arise from removing the capacitive isolation from inadvertently flipping the state of the memory cell. In one embodiment, the discharge path includes a voltage source, such as a step voltage pulse. In one embodiment, the discharge path includes a capacitor. Another advantage of the discharge path is that the capacitive isolation may be made stronger. The stronger capacitive isolation provides better protection against the snapback current from the threshold switching selector turning on.

One technique for reading programmable resistance memory cells is referred to as a globally referenced read. A globally referenced read is sometimes referred to as a midpoint read or midpoint referenced read. A globally referenced read may use a reference voltage that is between the lower resistance state (LRS) and the higher resistance state (HRS). Here, the LRS and HRS refer to the voltage that appears across the cell in response to the read current. For example, the midpoint reference may be a reference voltage that is midway between two voltages that correspond to sensing a cell having either the LRS or the HRS. In a forced current approach, memory cell's state is determined based on whether the sensed voltage, Vsense, is higher or lower than the midpoint reference voltage, Vref.

Another technique for reading programmable resistance memory cells is commonly referred to as a self-referenced read (SRR). In an SRR, rather than using a midpoint reference that is independent of the state of the cell, the reference is generated based on sensing the cell itself. In a destructive SRR, it is possible that the state of the memory cell is changed (e.g., destroyed) by a write operation of the SRR. One SRR technique includes a first read (Read1), followed by a destructive write to a known state (e.g., the high resistance state HRS), and a second read (Read2). The results of the two reads are compared to determine the original state of the cell. One technique for the first read is to apply a read current through the memory cell, resulting in a voltage across the cell having a magnitude that is representative of the resistance of the memory cell. The voltage is stored and may be adjusted (for example, up or down by 150 mV) for comparison with a voltage sample from the second read. The voltage adjustment can be approximately half the signal difference across the MRAM for each state. For example, if the MRAM low resistance state (LRS) is 25 Kohm, the high resistance state 50 Kohm, and the read current 15 μA, the difference from a state change is 375 mV so an adjustment of approximately 182.5 mV could be made from Read1 stored voltage of SRR. The determination of the original state of the memory cell depends on the difference between the first adjusted read voltage and the second read voltage. For example, if the first sampled voltage from Read1 of SRR was adjusted up and the write was to the HRS, then if the cell was originally in the HRS then the second sampled voltage from Read2 should be about the same as Read1 and therefore lower than the first read voltage after adjusting it up. However, if the cell was originally in the LRS, then the second sampled voltage from Read2 should be higher than the adjusted up voltage from Read1 due to the higher Read2 voltage resulting from writing the bit from low resistance LRS to the HRS.

In an embodiment the memory system is used to read programmable resistance memory cells that reside in a cross-point memory array. In a memory array with a cross-point type architecture, one set of conductive lines run across the surface of a substrate and another set of conductive lines are formed over the other set of conductive lines, running over the substrate in a direction perpendicular to the other set of conductive lines. The memory cells are located at the cross-point junctions of the two sets of conductive lines. Cross-point memory arrays are sometimes referred to as cross-bar memory arrays. In an embodiment, the memory cells each have a magnetoresistive memory element in series with an OTS, which may be referred to as MRAM memory cell. However, the cross-point memory array may have other types of memory cells. For example, the cross-point memory array may have memory cells of other technologies such as ReRam, PCM (Phase Change Memory), FeRam. Also, the threshold switching selector is not required to be an OTS and could be a pair of diodes with anode to cathode . . .

In some embodiments, the programmable resistance memory cell has a magnetoresistive random access memory (MRAM) element. As used herein, direction of magnetization is the direction that the magnetic moment is oriented with respect to a reference direction set by another element of the MRAM ("the reference layer"). In some embodiments, the low resistance is referred to as a parallel or P-state or LRS, and the high resistance is referred to as an anti-parallel or AP-state or HRS. MRAM can use the spin-transfer torque effect to change the direction of the magnetization from P-state to AP-state and vice-versa, which typically requires bipolar (bi-directional write) operation for writes. However, SRR of programmable resistance memory cells as disclosed herein is not limited to memory cells having MRAM elements or OTS elements.

FIG. 1 is a block diagram of one embodiment of a non-volatile memory system (or more briefly "memory system") 100 connected to a host system 120. Memory system 100 can implement the technology presented herein for a system for reading a programmable resistance memory cell having a threshold switching selector. In an embodiment, the memory cells have a programmable resistance memory element (e.g., MRAM element) in series with a threshold switching selector such as an OTS. Many types of memory systems can be used with the technology proposed herein. Example memory systems include dual in-line memory modules (DIMMs), solid state drives ("SSDs"), memory cards and embedded memory devices; however, other types of memory systems can also be used.

Memory system 100 of FIG. 1 comprises a memory controller 102, memory 104 for storing data, and local memory 140 (e.g., MRAM, ReRAM, DRAM). The local memory 140 may be non-volatile and retain data after power off. The local memory 140 may be volatile and not be expected to retain data after power off. In one embodiment the local memory 140 is MRAM. In an embodiment, the local memory MRAM is not required to retain data after power-off. However, the local memory MRAM may retain data after power-off. In one embodiment, memory controller 102 and/or local memory controller 164 provides access to programmable resistance memory cells in local memory 140. For example, memory controller 102 may provide for access in a cross-point array of MRAM cells in local memory 140. In another embodiment the memory controller 102 or interface 126 or both are eliminated and the memory packages are connected directly to the host 120 through a bus such as DDRn. Or they are connected to a Host memory management unit (MMU). In another instance, the memory controller 102 or portions are moved onto the memory 104 for direct connection of the memory 104 to the host, such as by providing parity bits, ECC, and wear level on the memory 104 along with an DDRn interface to/from the host or MMU. The term memory system, as used throughout this document, is not limited to memory system 100. For example, the local memory 140 or the combination of local memory 140 and local memory controller 164 could be considered to be a memory system. Likewise, host memory 124 or the combination of host processor 122 and host memory 124 considered to be a memory system.

The components of memory system 100 depicted in FIG. 1 are electrical circuits. The memory controller 102 has host interface 152, processor 156, ECC engine 158, memory interface 160, local memory controller 164, refresh logic 172, and wear level 174. The host interface 152 is connected to and in communication with host 120. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, local memory controller 164, refresh logic 172, and wear level 174. Local memory controller 164 is used to operate and communicate with local high speed memory 140 (e.g., MRAM). In other embodiments, local high speed memory 140 can be DRAM, SRAM or another type of volatile memory.

ECC engine 158 performs error correction services. For example, ECC engine 158 performs data encoding and decoding of parity bits provided on or off the memory as part of the code word used for error correction of the data fetched from memory 140 or 104. In one embodiment, ECC engine 158 is an electrical circuit programmed by software. For example, ECC engine 158 can be a processor that can be programmed. In other embodiments, ECC engine 158 is a custom and dedicated hardware circuit without any software. In one embodiment, the function of ECC engine 158 is implemented by processor 156. In one embodiment, local memory 140 has an ECC engine with or without a wear level engine. In one embodiment, memory 104 has an ECC engine with or without a wear level engine.

Processor 156 performs the various controller memory operations, such as programming, erasing, reading, and memory management processes including wear level. A separate wear level 174 is depicted, but the wear level 174 may be implemented by processor 156. Also, refresh logic 172 is depicted, but the refresh may also be implemented by the processor 156. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory dies. To implement this system, memory controller 102 (e.g., the translation module) performs address translation between the logical addresses used by the host and the physical addresses used by the memory die. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in memory 104 and a subset of the L2P tables are cached (L2P cache) in the local high speed memory 140.

Memory interface 160 communicates with memory 104. In an embodiment, memory 104 contains programmable resistance memory cells in a cross-point array. In an embodiment, memory 104 contains NAND memory cells. In one embodiment, memory interface provides a Toggle Mode interface. Other interfaces can also be used. In some example implementations, memory interface 160 (or another portion of controller 102) implements a scheduler and buffer for transmitting data to and receiving data from one or more memory die.

In one embodiment, local memory 140 has an ECC engine. Local memory 140 may be used to help perform other functions such as wear leveling. Further details of on-chip memory maintenance are described in U.S. Pat. No. 10,545,692, titled "Memory Maintenance Operations During Refresh Window", and U.S. Pat. No. 10,885,991, titled "Data Rewrite During Refresh Window", both of which are hereby incorporated by reference in their entirety. In an embodiment, the local memory 140 is synchronous. In an embodiment, the local memory 140 is asynchronous.

In one embodiment, memory 104 comprises a plurality of memory packages. Each memory package includes one or more memory dies. Therefore, memory controller 102 is connected to one or more memory dies. In one embodiment, the memory package can include types of memory, such as storage class memory (SCM) based on programmable resistance random access memory (such as ReRAM, MRAM, FeRAM or RRAM) or a phase change memory (PCM). In one embodiment, memory controller 102 provides access to memory cells in a cross-point array in a memory 104.

Memory controller 102 communicates with host system 120 via an interface 152 that implements a protocol such as, for example, Compute Express Link (CXL). Or such controller can be eliminated and the memory packages can be placed directly on the host bus, DDRn or CXL for examples. For working with memory system 100, host system 120 includes a host processor 122, host memory 124, and interface 126 connected along bus 128. Host memory 124 is the host's physical memory, and can be DRAM, SRAM, ReRAM, MRAM, non-volatile memory, or another type of storage. In an embodiment, host memory 124 contains a cross-point array of programmable resistance memory cells, with each memory cell comprising a programmable resistance memory element and a threshold switching selector in series with the programmable resistance memory element.

Host system 120 is external to and separate from memory system 100. In one embodiment, memory system 100 is embedded in host system 120. Host memory 124 may be referred to herein as a memory system. The combination of the host processor 122 and host memory 124 may be referred to herein as a memory system. In an embodiment, such host memory can be cross-point memory using MRAM.

Figure 2:
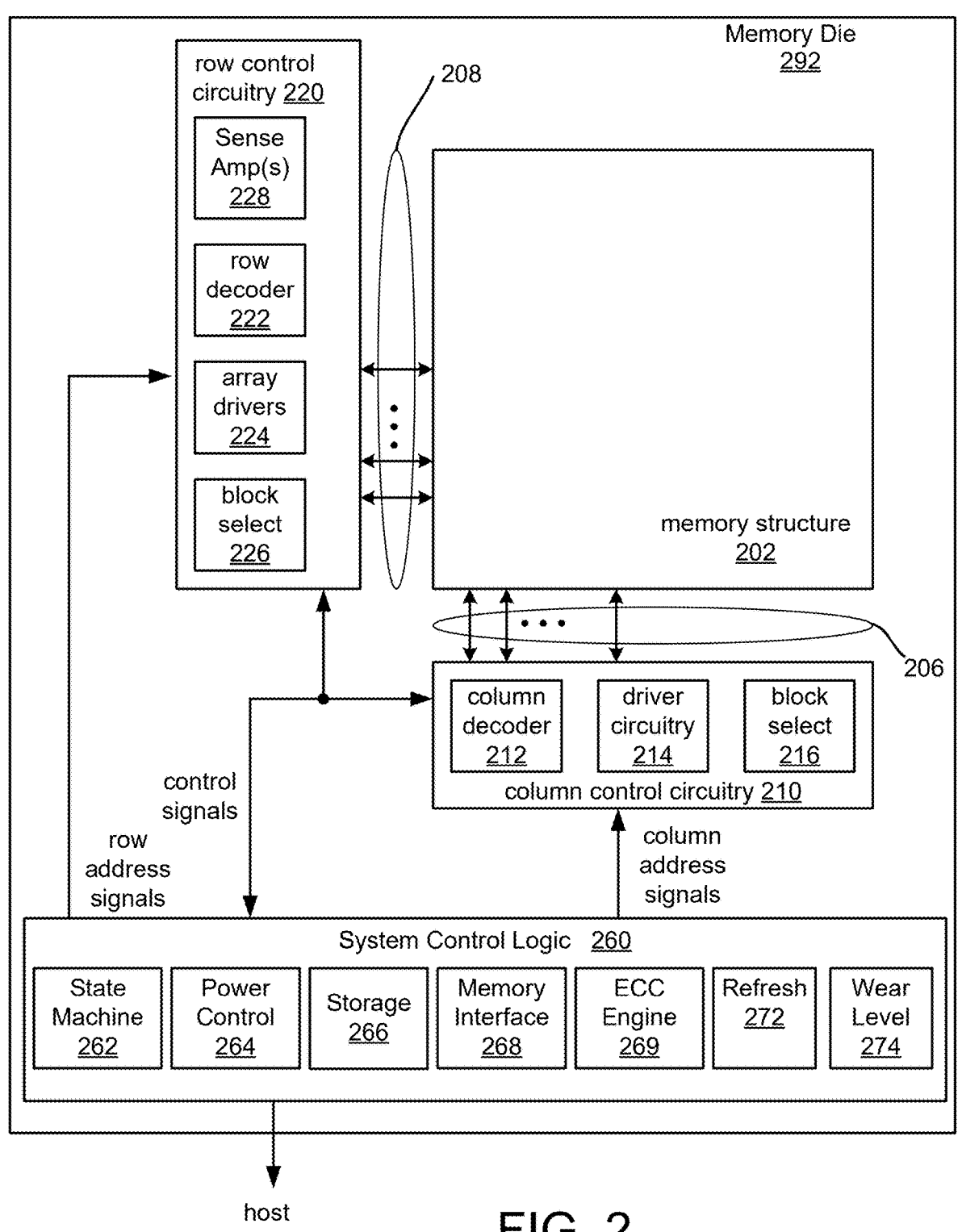
FIG. 2 is a block diagram of one embodiment of a memory die.

FIG. 2 is a block diagram that depicts one example of a memory die 292 that can implement the technology described herein. In one embodiment, memory die 292 is included in local memory 140, and in an embodiment memory die 292 is included in memory 104. In one embodiment, memory die 292 is included in host memory 124. Memory die 292 includes a memory structure 202 that can include any of memory cells described in the following. The memory structure 202 may include one or more memory arrays. The array terminal lines of memory structure 202 include the various layer(s) of word lines organized as rows, and the various layer(s) of bit lines organized as columns. However, other orientations can also be implemented, including for example diagonal patterns to save space. Memory die 292 includes row control circuitry 220, whose outputs 208 are connected to respective word lines of the memory structure 202. Row control circuitry 220 receives a group of M row address signals and one or more various control signals from System Control Logic circuit 260, and typically may include such circuits as row decoders 222, row drivers 224, and block select circuitry 226 for both reading and writing operations. Row control circuitry 220 may also include read/write circuitry. In an embodiment, row decode and control circuitry 220 has sense amplifiers 228, which each contain circuitry for sensing a condition (e.g., voltage) of a word line of the memory structure 202. In an embodiment, by sensing a word line voltage, a condition or bit state of a memory cell in a cross-point array is determined, either directly by a sense amp comparing the accessed memory cell voltage with a reference voltage. Or less directly by first accessing the memory cell and storing a read voltage generated by forcing a read current through the cell and adjusting it up or down by 150 mv (or half the voltage difference resulting from changing the bit state), then writing the cell to AP state, and again accessing the memory cell with a read current and comparing the resulting voltage with the stored voltage adjusted 150 mV for example (or half the difference in voltage resulting from two different bit states. Memory die 292 also includes column decode and control circuitry 210 whose input/outputs 206 are connected to respective bit lines of the memory structure 202. Although only a single block is shown for memory structure 202, a memory die can include multiple arrays or "tiles" that can be individually accessed. Column control circuitry 210 receives a group of N column address signals and one or more various control signals from System Control Logic 260, and typically may include such circuits as column decoders 212, column decoders and drivers 214, block select circuitry 216, as well as read/write circuitry, and I/O multiplexers.

System control logic 260 receives data and commands from a host system and provides output data and status to the host system. In other embodiments, system control logic 260 receives data and commands from a separate controller circuit and provides output data to that controller circuit, with the controller circuit communicating with the host system. Such controller system may implement an interface such as DDR, DIMM, CXL, PCIe and others. In another embodiment those data and commands are sent and received directly from the memory packages 104 to the Host without a separate controller, and any controller needed is within each die or within a die added to a multi-chip memory package. In some embodiments, the system control logic 260 can include a state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor. The system control logic 260 can also include a power control module 264 that controls the power, current source currents, and voltages supplied to the rows and columns of the memory structure 202 during memory operations and may include charge pumps and regulator circuit for creating regulating voltages, and on/off control of each for word line bit line selection of the memory cells. In some embodiments, the power control 264 includes one or more current sources. The current source(s) may be used to provide read and/or write currents. System control logic 260 includes storage 266, which may be used to store parameters for operating the memory structure 202. System control logic 260 also includes refresh logic 272 and wear leveling logic 274. Such system control logic may be commanded by the host 120 or memory controller 102 to refresh logic 272, which may load an on-chip stored row and column address (Pointer) which may be incremented after refresh. Such address bit(s) may be selected only (to refresh the OTS). Or such address may be read, corrected by steering through ECC engine 269, and then stored in a "spare" location, which is also being incremented (so all codewords are periodically read, corrected, and relocated in the entire chip under control of wear leveling logic 274) to in effect wear level so use of each bit across the chip is more uniform. Such operation may be more directly controlled by the host of an external controller, for example a PCIe or CXL or DDRn controller located separately from the memory chip or on the memory die.

Commands and data are transferred between memory controller 102 and the memory die 292 via memory controller interface 268 (also referred to as a "communication interface"). Such interface may be PCIe, CXL, DDRn for example. Memory controller interface 268 is an electrical interface for communicating with memory controller 102. Examples of memory controller interface 268 also include a Toggle Mode Interface. Other I/O interfaces can also be used. For example, memory controller interface 268 may implement a Toggle Mode Interface that connects to the Toggle Mode interfaces of memory interface 228/258 for memory controller 102. In one embodiment, memory controller interface 268 includes a set of input and/or output (I/O) pins that connect to the controller 102. In another embodiment, the interface is JEDEC standard DDRn or LPDDRn, such as DDR5 or LPDDR5, or a subset thereof with smaller page and/or relaxed timing.

System control logic 260 located in a controller on the memory die in the memory packages may include Error Correction Code (ECC) engine 269. ECC engine 269 may be referred to as an on-die ECC engine, as it is on the same semiconductor die as the memory cells. That is, the on-die ECC engine 269 may be used to encode data and parity bits that are to be stored in the memory structure 202, and to decode the decoded data and correct errors. The encoded data may be referred to herein as a codeword or as an ECC codeword. ECC engine 269 may be used to perform a decoding algorithm and to perform error correction. Hence, the ECC engine 269 may decode the ECC codeword. In an embodiment, the ECC engine 269 is able to decode the data more rapidly by direct decoding without iteration. Having the ECC engine 269 on the same die as the memory cells allows for faster decoding. The ECC engine 269 can use a wide variety of decoding algorithms including, but not limited to, Reed Solomon, a Bose-Chaudhuri-Hocquenghem (BCH), and low-density parity check (LDPC).

In some embodiments, all of the elements of memory die 292, including the system control logic 260, can be formed as part of a single die. In other embodiments, some or all of the system control logic 260 can be formed on a different die; e.g., external controller chip.

In one embodiment, memory structure 202 comprises a three-dimensional memory array of non-volatile or volatile memory cells in which multiple memory levels are formed above a single substrate, such as a wafer. The memory structure may comprise any type of non-volatile or volatile memory that are monolithically formed in one or more physical levels of memory cells having an active area disposed above a silicon or silicon on insulator (or other type of) substrate. In another embodiment, memory structure 202 comprises a two-dimensional memory array of non-volatile memory cells.

The exact type of memory array architecture or memory cell included in memory structure 202 is not limited to the examples above. Many different types of memory array architectures or memory technologies can be used to form memory structure 202. No particular non-volatile memory technology is required for purposes of the newly claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM or MRAM cross-point memory includes programmable resistance switching elements in series with an OTS selector arranged in cross-point arrays accessed by X lines and Y lines (e.g., word lines and bit lines). In another embodiment of cross-point is PCM in series with and OTS selector. In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive random access memory (MRAM) stores data using magnetic storage elements. The elements are formed from two ferromagnetic layers, each of which can hold a magnetization, separated by a thin insulating layer. For a field-controlled MRAM, one of the two layers is a permanent magnet set to a particular polarity; the other layer's magnetization can be changed by applying an external field to store memory. Other types of MRAM cells are possible. A memory device may be built from a grid of MRAM cells or as SOT magneto resistive memory. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). The memory cells are programmed by current pulses that can change the co-ordination of the PCM material or switch it between amorphous and crystalline states. Note that the use of "pulse" in this document does not require a square pulse but includes a (continuous or non-continuous) vibration or burst of sound, current, voltage, light, or other wave. And the current forced for a write can, for example, be driven rapidly to a peak value and then linearly ramped lower with, for example, a 500 ns edge rate. Such peak current force may be limited by a zoned voltage compliance that varies by position of the memory cell along the word line or bit line. In an embodiment, a phase change memory cell has a phase change memory element in series with a threshold switching selector such as an OTS.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2 can be grouped into two parts, the memory structure 202 and the peripheral circuitry, including all of the other elements. An important characteristic of a memory circuit is its capacity, which can be increased by increasing the area of the memory die 292 that is given over to the memory structure 202; however, this reduces the area of the memory die available for the peripheral circuitry or increases cost which is related to chip area. This can place quite severe restrictions on these peripheral elements. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die 292 is the amount of area to devote to the memory structure 202 and the amount of area to devote to the peripheral circuitry. Such tradeoffs may result in more IR drop from use of larger x-y arrays of memory between driving circuits on the word line and bit line, which in turn may benefit more from use of voltage limit and zoning of the voltage compliance by memory cell position along the word line and bit line.

Another area in which the memory structure 202 and the peripheral circuitry are often at odds is in the processing involved in forming these regions, since these regions often involve differing processing technologies and the trade-off in having differing technologies on a single die. For example, elements such as sense amplifier circuits, charge pumps, logic elements in a state machine, and other peripheral circuitry in system control logic 260 often employ PMOS devices. In some cases, the memory structure will be based on CMOS devices. Processing operations for manufacturing a CMOS die will differ in many aspects from the processing operations optimized for NMOS-only technologies.

Figure 3:
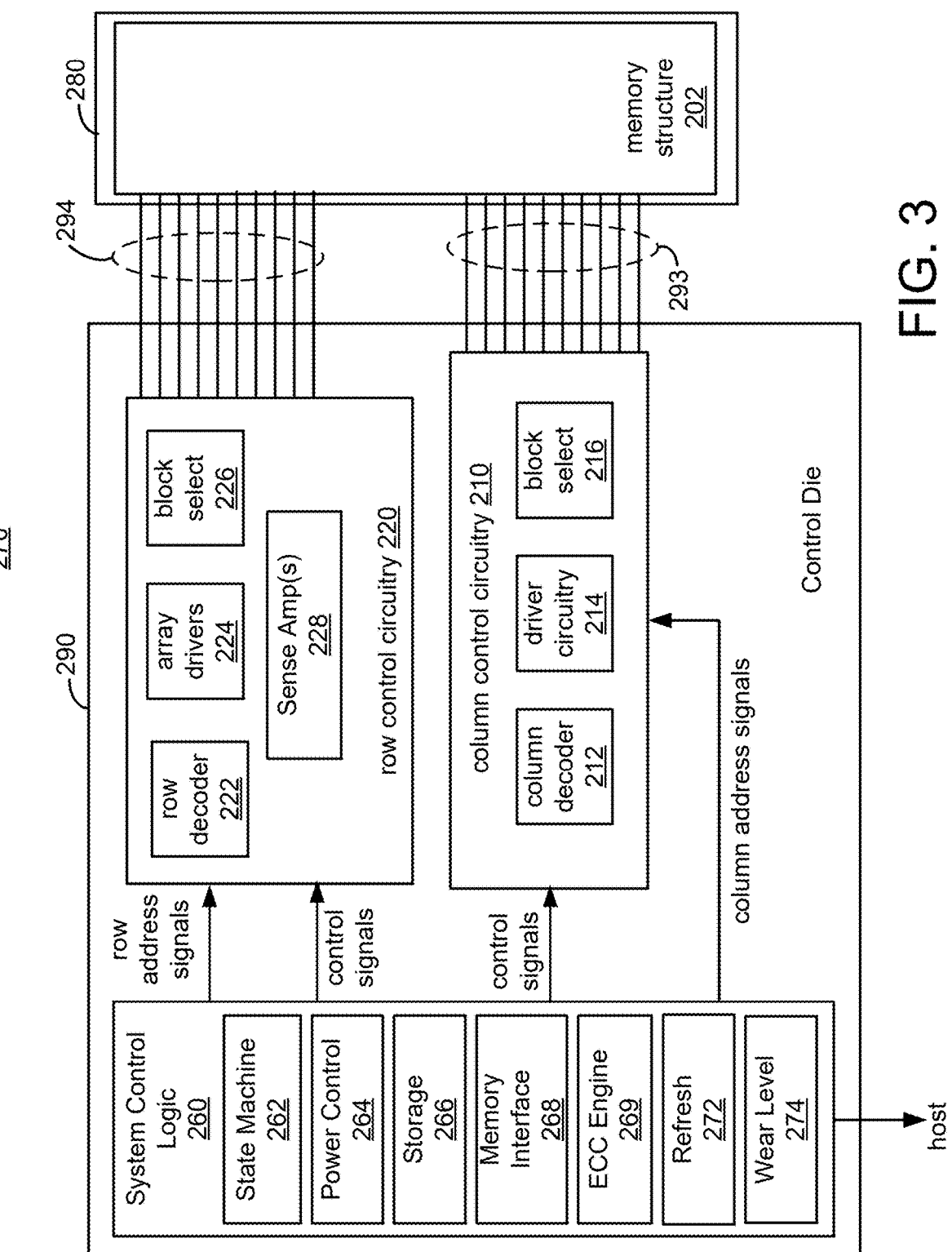
FIG. 3 is a block diagram of one embodiment of an integrated memory assembly containing a control die and a memory structure die.

To improve upon these limitations, embodiments described below can separate the elements of FIG. 2 onto separately formed die that are then bonded together. FIG. 3 depicts an integrated memory assembly 270 having a memory structure die 280 and a control die 290. The memory structure 202 is formed on the memory structure die 280 and some or all of the peripheral circuitry elements, including one or more control circuits, are formed on the control die 290. For example, a memory structure die 280 can be formed of just the memory elements, such as the array of memory cells of MRAM memory, PCM memory, ReRAM memory, or other memory type. Some or all of the peripheral circuitry, even including elements such as decoders, current sources, and sense amplifiers, can then be moved to the control die. This allows each of the semiconductor die to be optimized individually according to its technology. This allows more space for the peripheral elements, which can now incorporate additional capabilities that could not be readily incorporated were they restricted to the margins of the same die holding the memory cell array. The two die can then be bonded together in a bonded multi-die integrated memory assembly, with the array on the one die connected to the periphery elements on the other die. Although the following will focus on an integrated memory assembly of one memory die and one control die, other embodiments can use additional die, such as two memory die and one control die, for example.

As with memory die 292 of FIG. 2, the memory structure die 280 in FIG. 3 includes a memory structure 202 that can include multiple independently accessible arrays or "tiles." System control logic 260, row control circuitry 220, and column control circuitry 210 are located in control die 290. In some embodiments, all or a portion of the column control circuitry 210 and all or a portion of the row control circuitry 220 are located on the memory structure die 280. In some embodiments, some of the circuitry in the system control logic 260 is located on the on the memory structure die 280.

FIG. 3 shows column control circuitry 210 on the control die 290 coupled to memory structure 202 on the memory structure die 280 through electrical paths 293. For example, electrical paths 293 may provide electrical connection between column decoder 212, column driver circuitry 214, and block select 216 and bit lines of memory structure 202. Electrical paths may extend from column control circuitry 210 in control die 290 through pads on control die 290 that are bonded to corresponding pads of the memory structure die 280, which are connected to bit lines of memory structure 202. Each bit line of memory structure 202 may have a corresponding electrical path in electrical paths 293, including a pair of bond pads, which connects to column control circuitry 210. Similarly, row control circuitry 220, including row decoder 222, row drivers 224, block select 226, and sense amplifiers 228 are coupled to memory structure 202 through electrical paths 294. Each of electrical path 294 may correspond to, for example, a word line. Additional electrical paths may also be provided between control die 290 and memory structure die 280.

For purposes of this document, the phrase "a control circuit" can include one or more of memory controller 102, local memory controller 164, processor 156, system control logic 260, column control circuitry 210, row control circuitry 220, host processor 122, a micro-controller, a state machine, and/or other control circuitry, or other analogous circuits that are used to control non-volatile memory. The control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit. Such control circuitry may include drivers such as direct drive via connection of a node through fully on transistors (gate to the power supply) driving to a fixed voltage such as a power supply. Such control circuitry may include a current source driver.

For purposes of this document, the term "apparatus" can include, but is not limited to, one or more of memory system 100, local memory 140, the combination of local memory controller 164 and/or memory controller 102 and local memory 140, memory 104, memory die 292, integrated memory assembly 270, and/or control die 290.

In the following discussion, the memory structure 202 of FIGS. 2 and 3 will be discussed in the context of a cross-point architecture. In a cross-point architecture, a first set of conductive lines or wires, such as word lines, run in a first direction relative to the underlying substrate and a second set of conductive lines or wires, such a bit lines, run in a second direction relative to the underlying substrate. The memory cells are sited at the intersection of the word lines and bit lines. The memory cells at these cross-points can be formed according to any of a number of technologies, including those described above. The following discussion will mainly focus on embodiments based on a cross-point architecture using MRAM memory cells, each in series with a threshold switching selector such as Ovonic Threshold Switch (OTS) to comprise a selectable memory bit. However, embodiments are not limited to providing currents to a cross-point architecture having MRAM cells, each with magnetic memory element in a series OTS selector. For example, the cross-point memory array may have memory cell of other technologies such as ReRam, PCM (Phase Change Memory), or FeRam.

Figure 4A:
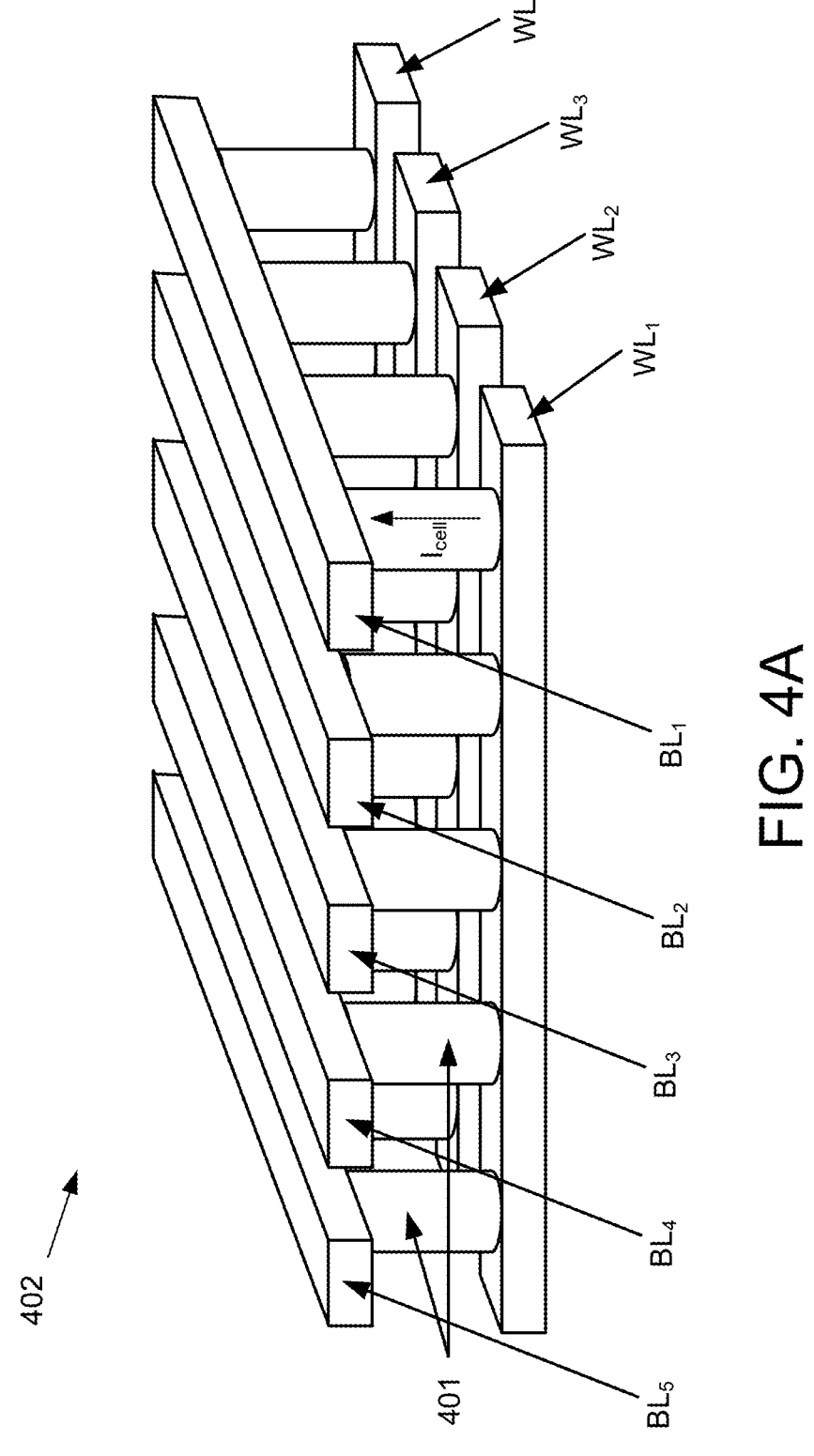
FIG. 4A depicts one embodiment of a portion of a memory array that forms a cross-point architecture in an oblique view.

FIG. 4A depicts one embodiment of a portion of a memory array 402 that forms a cross-point architecture in an oblique view. Memory array 402 of FIG. 4A is one example of an implementation for memory structure 202 in FIG. 2 or 3B, where a memory die 292 or memory structure die 280 can include multiple such memory arrays 402. The memory array 402 may be included in local memory 140 or host memory 124. The bit lines $BL_1$-$BL_5$ are arranged in a first direction (represented as running into the page) relative to an underlying substrate (not shown) of the die and the word lines $WL_1$-$WL_5$ are arranged in a second direction perpendicular to the first direction, or diagonal to provide intersections where memory cells are interconnected between WLs and BLs. FIG. 4A is an example of a horizontal cross-point structure in which word lines $WL_1$-$WL_5$ and $BL_1$-$BL_5$ both run in a horizontal direction relative to the substrate, while the memory cells, two of which are indicated at 401, are oriented so that the current through a memory cell (such as shown at $I_{cell}$) runs in the vertical direction. In a memory array with additional layers of memory cells, such as discussed below with respect to FIG. 4D, there would be corresponding additional layers of bit lines and word lines. One pattern, for example, would be from the bottom layer: WL, memory cell, BL, memory cell, WL, WL, memory cell, BL memory cell, WL.

As depicted in FIG. 4A, memory array 402 includes a plurality of memory cells 401. The memory cells 401 may include re-writeable memory elements, such as can be implemented using ReRAM, MRAM, PCM, or other material with a programmable resistance. The memory cells 401 may be referred to herein as programmable resistance memory cells. One type of programmable resistance memory cell is referred to as an MRAM cell, which is a memory cell that includes a MRAM memory element. The memory cells 401 may also include threshold switching selectors as an additional series element within the memory cells 401, such as can be implemented using an Ovonic Threshold Switch (OTS), Volatile Conductive Bridge (VCB), Metal-Insulator-Metal (MIM), or other material that provides a highly non-linear dependence of current or resistance for varying select voltage. The following discussion will focus on memory cells composed of an MRAM memory elements combined in series with an Ovonic Threshold switch elements, although much of the discussion can be applied more generally. The current in the memory cells of the first memory level is shown as flowing upward as indicated by arrow $I_{cell}$, but current can flow in either direction to either read or write the memory cell bit state, as is discussed in more detail in the following.

Figure 4B:
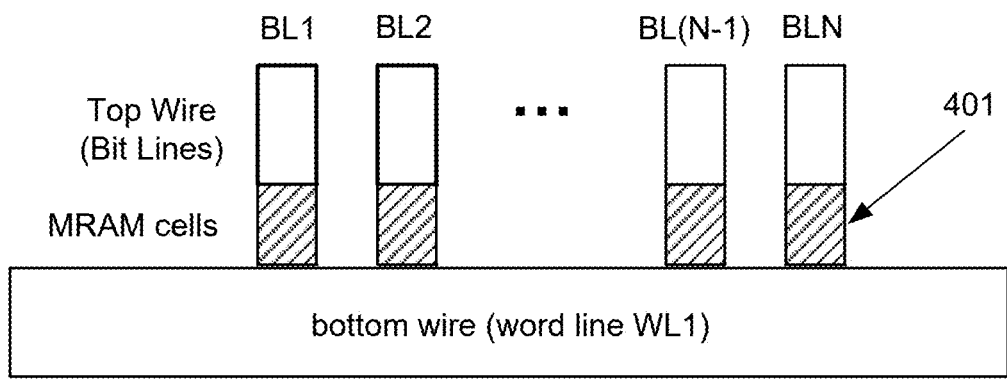
FIGS. 4B and 4C respectively present side and top views of the cross-point structure in FIG. 4A.
Figure 4C:
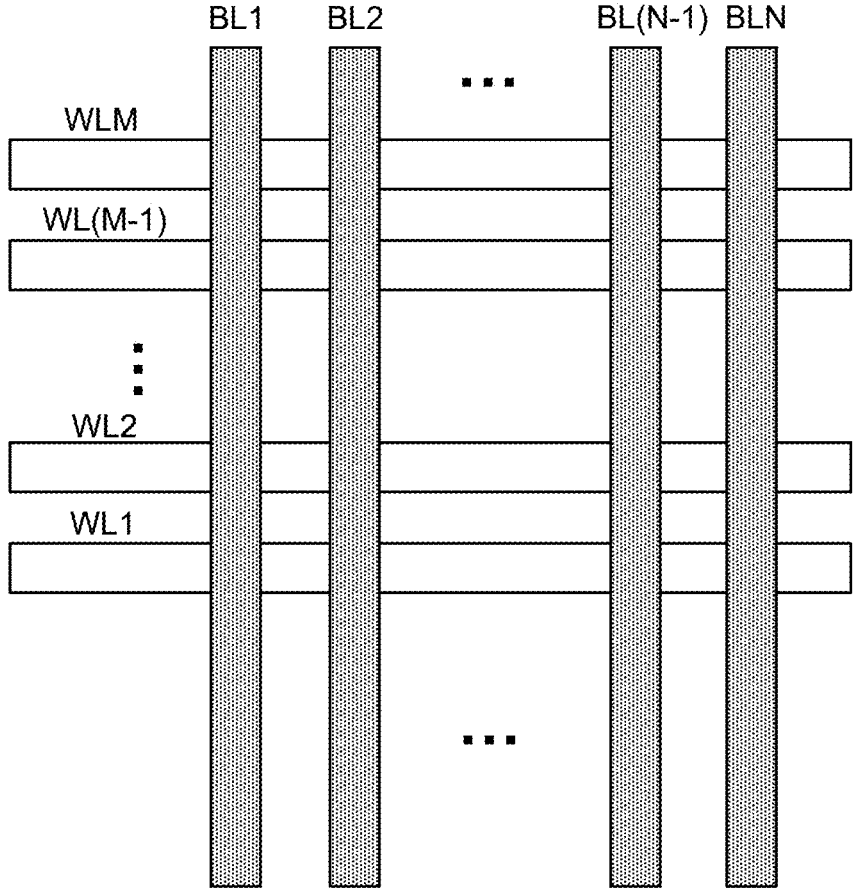

FIGS. 4B and 4C respectively present side and top views of the cross-point structure in FIG. 4A. The sideview of FIG. 4B shows one bottom wire, or word line, $WL_1$ and the top wires, or bit lines, $BL_1$-$BL_n$. At the cross-point between each top wire and bottom wire is an MRAM memory cell 401, although PCM, ReRAM, FeRAM, or other technologies can be used as the memory element. FIG. 4C is a top view illustrating the cross-point structure for M bottom wires $WL_1$-$WL_M$ and N top wires $BL_1$-$BL_N$. In a binary embodiment, the MRAM cell at each cross-point can be programmed into one of two resistance states: high and low. More detail on embodiments for an MRAM memory cell design and techniques for their reading are given below. In some embodiments, sets of these wires are arrayed continuously as a "tile," and such tiles may be paired adjacently in the Word Line (WL) direction and orthogonally in the Bit Line direction to create a module. Such a module may be composed of 2×2 tiles to form a four tile combination wherein the WL drivers between the tiles is "center driven" between the tiles with the WL running continuously over the transistor driver at the approximate center of the line. Similarly, BL drivers may be located between the pair of tiles paired in the BL direction to be center driven, whereby the transistor driver and its area is shared between a pair of tiles. Vias of copper or other types of low resistance may decode and connect the transistor driver/selects to the WL or BL. In addition to the memory element in the memory cell between WL and BL may also be included a series select element such as an OTS.

The cross-point array of FIG. 4A illustrates an embodiment with one layer of word lines and bits lines, with the MRAM or other memory technology for the memory cells sited at the intersection of the two sets of conducting lines. To increase the storage density of a memory die, multiple layers of such memory cells and conductive lines can be formed. A two-layer example is illustrated in FIG. 4D.

Figure 4D:
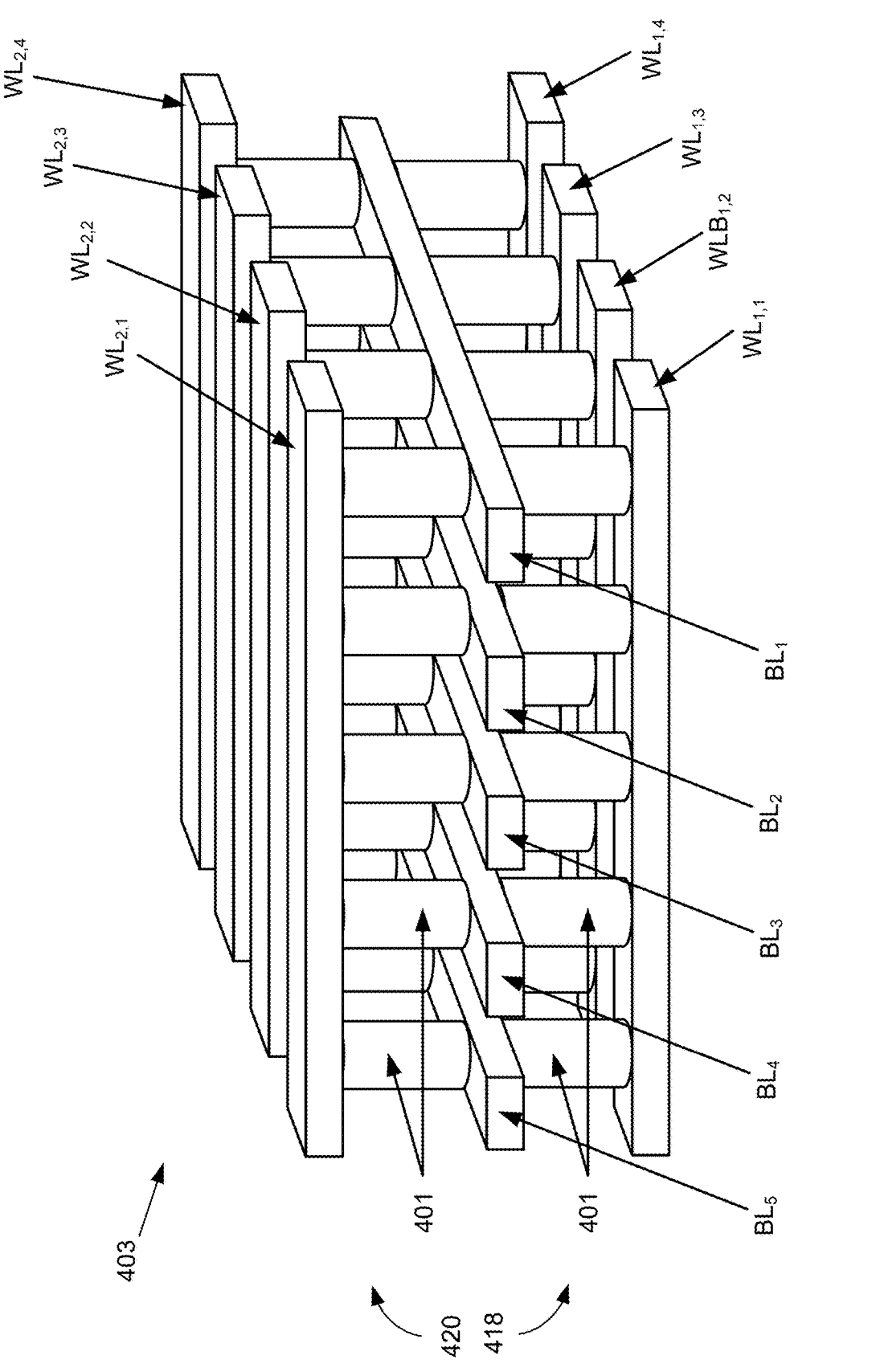
FIG. 4D depicts an embodiment of a portion of a two-level memory array that forms a cross-point architecture in an oblique view.

FIG. 4D depicts an embodiment of a portion of a two-level memory array that forms a cross-point architecture in an oblique view. As in FIG. 4A, FIG. 4D shows a first layer 418 of memory cells 401 of a memory array 403 connected at the cross-points of the first layer of word lines $WL_{1.1}$-$WL_{1.4}$ and bit lines $BL_1$-$BL_5$ above. Memory array 403 may be included in memory structure 202 of FIG. 2 or 3B. A second layer 420 of memory cells is formed above the bit lines $BL_1$-$BL_5$ and between these bit lines and a second set of word lines $WL_{2.1}$-$WL_{2.4}$. In effect the BLs are shared. In the alternative a second layer may include another deck of BL above the BL shown and below the $2^{nd}$ deck of WL. Although FIG. 4D shows two layers, 418 and 420, of memory cells, the structure can be extended upward through additional alternating layers of word lines and bit lines in a similar pattern. Depending on the embodiment, the word lines and bit lines of the array of FIG. 4D can be biased for read or program operations such that current in each layer flows from the word line layer to the bit line layer or the other way around. The two layers can be structured to have current flow in the same direction in each layer for a given operation or to have current flow in the opposite directions by driver selection in the positive or negative direction. The memory cell may be placed in the same orientation within the first and second layers enabling use of current in oppositive directions by layer to read or write. Or the memory cell placed in a reversed or flipped direction when placed between the BL and WL in the second layer (enabling use of current in the same direction as is used to read or write in memory cells within the first layer. As will be apparent to someone reasonably skilled in the art, the 2 layers can be extended to 3 or more layers.

The use of a cross-point architecture allows for arrays with a small footprint and several such arrays can be formed on a single die. The memory cells formed at each cross-point can be a resistive type of memory cell, where data values are encoded as different resistance levels, either two levels such as with MRAM or into two or more levels for other memory element technologies such as PCM. Depending on the embodiment, the memory cells can be binary valued, having either a low resistance state or a high resistance state, or multi-level cells (MLCs) that can have additional resistance intermediate to the low resistance state and high resistance state. The cross-point arrays described here can be used in the memory die 292 of FIG. 2, the local memory 140 in FIG. 1, and/or the host memory 124 in FIG. 1, or in any other configuration where additional memory is useful. Resistive type memory cells can be formed according to many of the technologies mentioned above, such as ReRAM, PCM, FeRAM, or MRAM. The following discussion is presented mainly in the context of memory arrays using a cross-point architecture with binary valued MRAM memory cells, although much of the discussion is more generally applicable to other memory elements in memory cells within a cross-point array or other configurations apparent to those reasonably skilled in the art.

Figure 5:
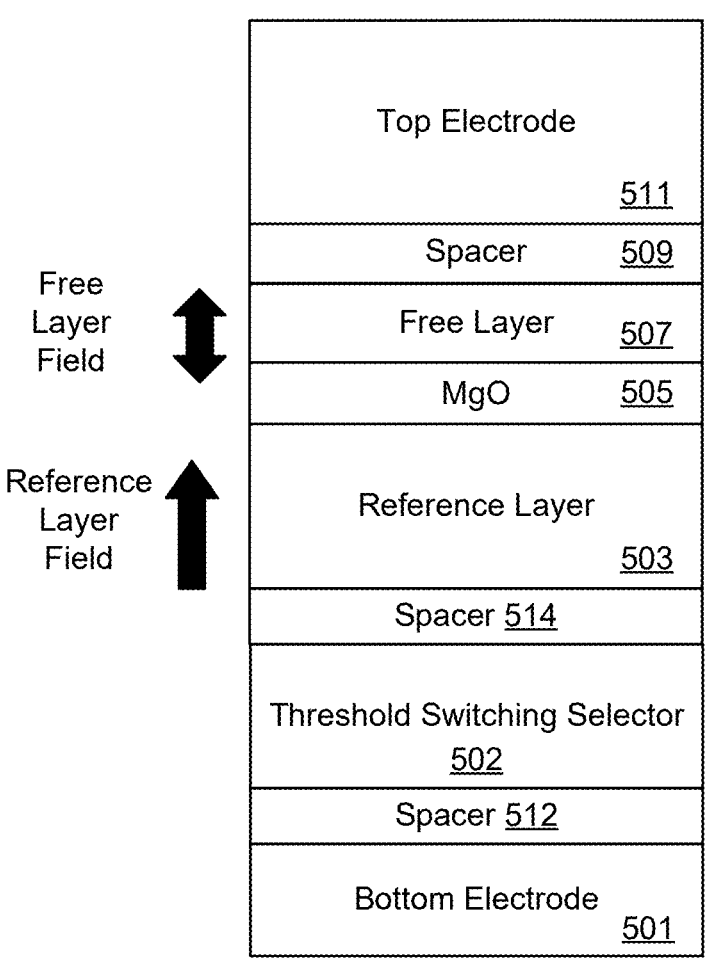
FIG. 5 illustrates an embodiment for the structure of an MRAM memory cell, here for example the selected cell is driven by a current source to read or write.

FIG. 5 illustrates the structure of an embodiment for an MRAM cell. The MRAM cell may be used as the programmable resistance memory cell 401 in, for example, FIGS. 4A-4D. The MRAM cell includes a bottom electrode 501, spacer 512, a threshold switching selector 502, spacer 514, a pair of magnetic layers (reference layer 503 and free layer 507) separated by a separation or tunneling layer of, in this example, magnesium oxide (MgO) 505, and then a top electrode 511 separated from the free layer 507 by a spacer 509. The spacer 509 can consist of an MgO capping layer in contact with the free layer 507. The spacer 509 can also contain additional metal layers. In another embodiment, the locations of the reference layer 503 and free layer 507 are switched, with the reference layer 503 on top of MgO 505, and the free layer 507 below MgO 505. In another embodiment, the location of the threshold switching selector 502 is between the free layer 507 and the top electrode 511.

In some embodiments, the bottom electrode 501 is a word line and the top electrode 511 is a bit line. In other embodiments, the bottom electrode 501 is a bit line and the top electrode 511 is a word line. The state of the memory cell is based on the relative orientation of the magnetizations of the reference layer 503 and the free layer 507: if the two layers are magnetized in the same direction, the memory cell will be in a parallel (P) low resistance state (LRS); and if they have the opposite orientation, the memory cell will be in an anti-parallel (AP) high resistance state (HRS). An MLC embodiment would include additional intermediate states. The orientation of the reference layer 503 is fixed and, in the example of FIG. 5, is oriented upward. Reference layer 503 is also known as a fixed layer or pinned layer. The reference layer 503 can be composed of multiple ferromagnetic layers coupled anti-ferromagnetically in a structure commonly referred to a synthetic anti-ferromagnet or SAF for short.

Data is written to an MRAM memory cell by programming the free layer 507 to either have the same orientation or opposite orientation relative to the reference layer 503. An array of MRAM memory cells may be placed in an initial, or erased, state by setting all of the MRAM memory cells to be in the low resistance state in which all of their free layers have a magnetic field orientation that is the same as their reference layers. Each of the memory cells is then selectively programmed (also referred to as "written") by placing its free layer 507 to be in the high resistance state by reversing the magnetic field to be opposite that of the reference layer 503. The reference layer 503 is formed so that it will maintain its orientation when programming the free layer 507. The reference layer 503 can have a more complicated design that includes synthetic anti-ferromagnetic layers and additional reference layers. For simplicity, the figures and discussion omit these additional layers and focus only on the fixed magnetic layer primarily responsible for tunneling magnetoresistance in the cell.

The threshold switching selector 502 has a high resistance (in an off or non-conductive state) until it is biased to a voltage higher than its threshold voltage or current above its threshold current, and until its voltage bias falls below Vhold (also known as "Voffset") or current below Ihold. After Vt is exceeded and while Vhold is exceeded across the switching selector, the switching selector has a low resistance (in an on or conductive state). The threshold switching selector remains on until its current is lowered below a holding current Ihold, or the voltage is lowered below a holding voltage, Vhold. When this occurs, the threshold switching selector returns to the off (higher) resistance state. Accordingly, to program a memory cell at a cross-point, a voltage or current is applied which is sufficient to turn on the associated threshold switching selector and set or reset the memory cell; and to read a memory cell, the threshold switching selector similarly is activated by being turned on before the resistance state of the memory cell is determined. One set of examples for a threshold switching selector is an ovonic threshold switching material of an Ovonic Threshold Switch (OTS). Example threshold switching materials include Ge—Se, Ge—Se—N, Ge—Se—As, Ge—Se—Sb—N, Ge58Se42, GeTe6, Si—Te, Zn—Te, C—Te, B—Te, Ge—As—Te—Si—N, Ge—As—Se—Te—Si and Ge—Se—As—Te, with atomic percentages ranging from a few percent to more than 90 percent for each element. In an embodiment, the threshold switching selector is a two terminal device. The threshold switching selector 502 can also contain additional conducting layers on the interface with the reference layer 503. For example, spacer 514 is depicted between switching selector 502 and reference layer 503. The spacer layer 514 on the interface with reference layer 503 can be a single conducting layer or composed of multiple conducting layers. The threshold switching selector 502 can also contain additional conducting layers on the interface with the bottom electrode 501. For example, spacer 512 is depicted between switching selector 502 and reference layer 503. The spacer layer 512 on the interface with bottom electrode 501 can be a single conducting layer or composed of multiple conducting layers. Examples of conducting layers adjacent to the OTS include carbon, carbon nitride, carbon silicide, carbon tungsten, titanium, titanium nitride, tungsten, tungsten nitride, tantalum, tantalum nitride, and others. Threshold voltage switches have a Threshold Voltage (Vt) above which the resistance of the device changes substantially from insulating, or quasi insulating, to conducting.

In an embodiment, a current-force approach is used to access the MRAM cell. The current-force approach may be used to read or write the MRAM cell. In the current-force approach, an access current (e.g., $I_{read}$ or $I_{write}$) is driven through the bottom electrode 501 by a current driver. The current will be provided by a transistor or resistor based current source. In an embodiment, the current driver may be a part of the address selected row driver circuitry (e.g., array drivers 224) for the electrode 501. However, alternatively the current driver may be a part of the address selected column driver circuitry (e.g., driver circuitry 214) for the electrode 501. A voltage (e.g., $V_{select}$) is provided to the top electrode 511. Herein, the terms "read current" ($I_{read}$) and "write current" ($I_{write}$) will be used in connection with access currents that are driven through MRAM cells (or other programmable resistance cells). The write current may change the state of the MRAM cell. As an example, a write current of about 30 μA for 50 ns may be used for an MRAM cell with a Critical Dimension (CD) of approximately 20 nanometers with RA 10 Ωμm² to switch the MRAM state from the P-state to the AP-state. Read currents may be about half the write current if applied for a limited time, such as <20 ns. A write current that flows in one direction through the MRAM cell will change an AP-state MRAM cell to the P-state. A write current that flows in the other direction, such as in the read direction, through the MRAM cell will change a P-state MRAM cell from the P-state to the AP-state. In general until the cell state is determined or a voltage level is captured and stored that correlates to the memory cell state, a read current will preferably be set low enough and the read duration short enough so as not to change the state of an MRAM cell from the P-state to the AP-state or from the AP-state to the P-state during read. Typically the write current required to switch the MRAM state from the P-state to the AP-state is larger in absolute magnitude than the write current required to switch the MRAM state from the AP-state to the P-state, so this may be a preferred direction to read for offering my margin against a state change before the bit state is correctly sensed. Current magnitudes may be adjusted accordingly by write direction, or the current used for P to AP if a single magnitude is used.

In some embodiments, a read current may be applied in a P2AP direction or, alternatively, in an AP2P direction. In some embodiments, the MRAM cell is read by performing an SRR (self-referenced-read). In one embodiment, the SRR has a first read (Read1 in the P2AP direction), a first write (Write 1 to the AP-state), and a second read (Read2 in the P2AP direction). Then the original state of the cell may be restored by a second write (Write_Back to the P-state for bits initially in the P-state). Or in another embodiment, the SRR read current and destructive write currents are both reversed, for example, when addressing the second layer with a memory cell oriented the same as in the first layer.

In an embodiment, the voltage level of the memory cell due to Read1 in the P2AP direction is sensed and stored, for example on a capacitor; or by conversion to digital bits by an Analog to Digital converter and the bits stored in memory, for example in SRAM until after use in Read2. The state stored on a capacitor can be adjusted, for example, 150 mv positive or negative by forcing a voltage on one terminal of a capacitor connected to the storage capacitor. Or the digital stored level can be adjusted by digitally adding or subtracting 150m V to the stored bits. The 150 mV can be adjusted to be dependent on the typical bit resistance. For example, if the bit low resistance state is 25K ohms and the high resistance 50K ohms, the difference is 25K ohms. If the read current is 15 μA, the difference voltage between the states if 25 Kohms×15 μA=375 mV, making a choice of 150m V acceptable but perhaps suggesting 187.5 mV may be more optimum, for example.

Although the foregoing describes reads in the P2AP direction and destructive writes to the AP-state (with write back after SRR to the P-state), in an alternative embodiment the first SRR has a first read (Read1 in the AP2P direction), a destructive write (Write 1) to the P-state and a second read (Read2) in the AP2P direction.

In one embodiment, the MRAM cell is read by applying, for example, approximately 0V to the top electrode 511 by turning on a transistor connected between 511 and a power supply, while driving a current of, for example, 15 micro- Amperes (μA) through the bottom electrode 501. This read current may flow from the bottom electrode 501 to the top electrode 511. Note that the read may be Read1 or Read2 in the P2AP direction. P2AP means current flows in the direction that would write the bit from P to AP or AP to AP. In some embodiments, data is written to the MRAM cell using a bipolar write operation. In one embodiment, the MRAM cell is written from the AP-state to the P-state by applying, for example, 3V to the top electrode 511, while driving a write current of, for example, −30 μA through the bottom electrode 501. This write current will flow from the top electrode 511 to the bottom electrode 501. In one embodiment, the MRAM cell is written from the P-state to the AP-state by applying, for example, 0V to the top electrode 511, while driving a current of, for example, 30 μA through the bottom electrode 501. This write current will flow from electrode 501 to the electrode 511.

As an alternative to the approach in FIG. 5, the select voltage can be applied to the bottom electrode 501 with the access current applied through the top electrode 511. In one such embodiment, the MRAM cell is read by applying, for example, 3V to the bottom electrode 501, while driving a read current of, for example, −15 μA through the top electrode 511. This read current may flow from the bottom electrode 501 to the top electrode 511.

In one embodiment, the MRAM cell is written from the AP-state to the P-state by applying, for example, −3V to the bottom electrode 501, while driving a write current of, for example, 30 μA through the top electrode 511. The electron current will flow from the bottom electrode 501 to the top electrode 511. In one embodiment, the MRAM cell is written from the P-state to the AP-state by applying, for example, 0V to the bottom electrode 501, while driving a current of, for example, −30 μA through the top electrode 511. The electron current will flow from the top electrode 511 to the bottom electrode 501. The direction of the current polarity to switch the magnetization of the bit into the P or AP state can vary based on reference layer design and the location of the reference layer with respect to the free layer.

Some biasing techniques may result in voltage across non-selected memory cells of the array, which can induce "leakage" currents in non-selected memory cells. Although this wasted power consumption can be mitigated to some degree by designing the memory cells to have relatively high resistance levels for both high and low resistance states when WL or BL is address unselected, this overhead leakage will still result in increased current and power consumption as well as placing additional design constraints on the design of the memory cells and the array due to lack of read and write margin. One approach to address this unwanted current leakage is to place a selector element in series with each MRAM or other resistive (e.g., ReRAM, PCM) memory cell. For example, a select transistor can be placed in series with each resistive memory cell element in FIGS. 4A-4D so that the memory cells 401 is now a composite of a select transistor and a programmable resistance. Such an architecture may be referred to as 1T1R. Use of a select transistor, however, requires the introduction of additional control lines and cell area to be able to turn on the corresponding transistor of a selected memory cell. Additionally, transistors will often not scale in the same manner as the resistive memory element write current, so that as memory arrays move to smaller sizes the use of transistor based selectors can be a limiting factor in reducing cost, for example. An alternate approach to select transistors is the use of a threshold switching selector (e.g., threshold switching selector 502) in series with the programmable resistive element.

A two terminal threshold switching selector does not require the aforementioned additional control lines and additional cell area to be able to turn on the corresponding select transistor of a selected memory cell. In some embodiments, the memory system performs a read as disclosed herein to read memory cells having a two terminal threshold switching selector in series with a programmable resistance memory element.

Figure 6A:
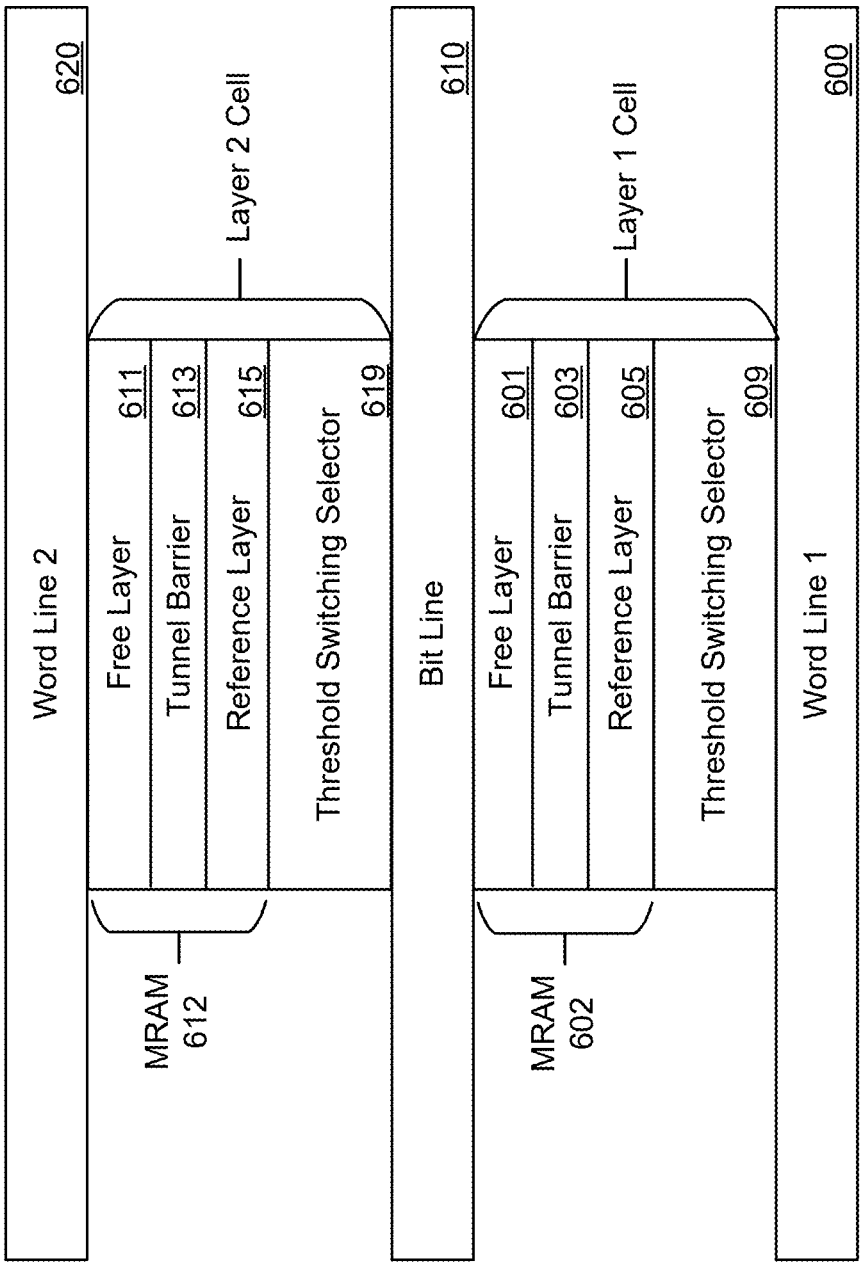
FIGS. 6A and 6B illustrate embodiments for the incorporation of threshold switching selectors into an MRAM memory array having a cross-point architecture.
Figure 6B:
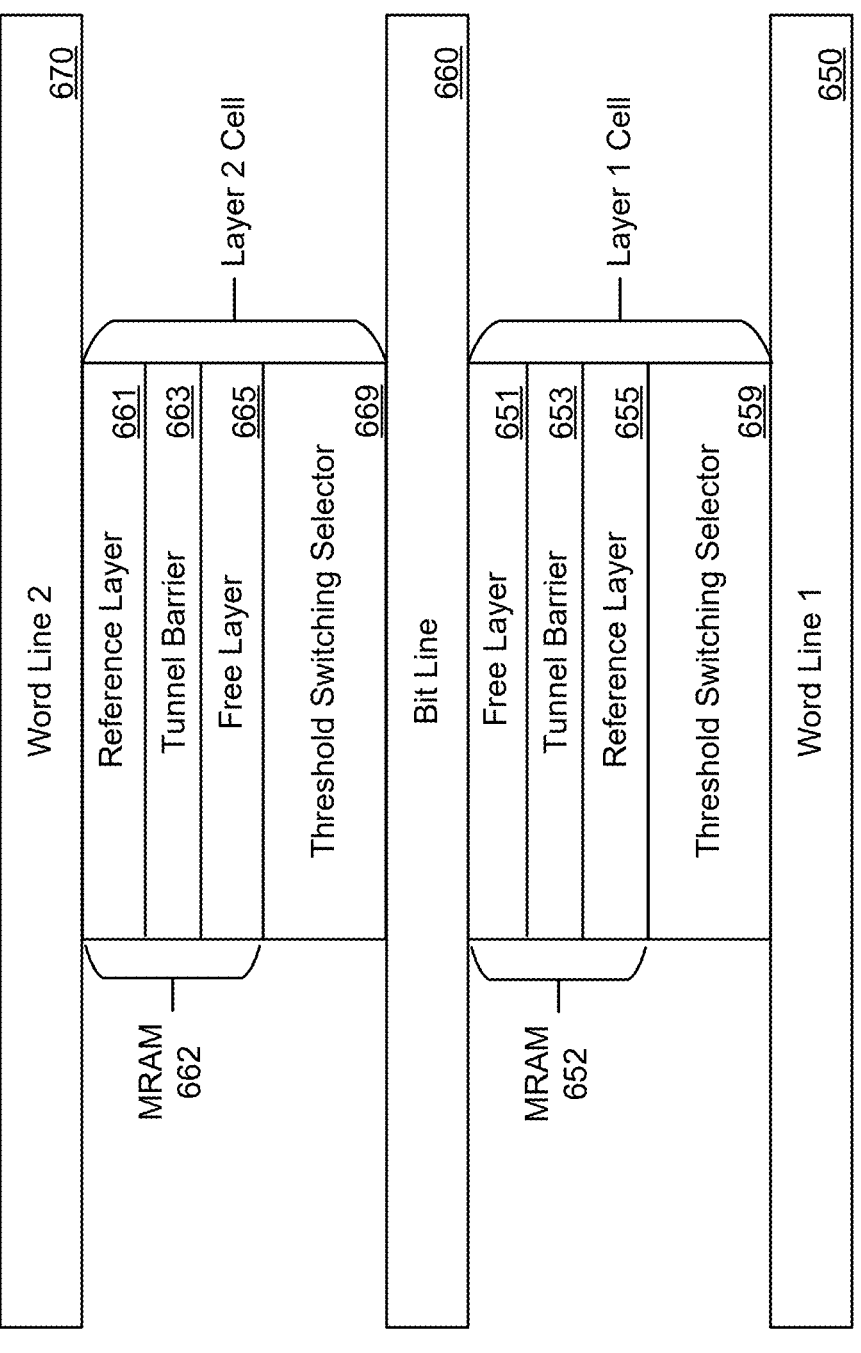

FIGS. 6A and 6B illustrate embodiments for the incorporation of threshold switching selectors into an MRAM memory array having a cross-point architecture. The examples of FIGS. 6A and 6B show two MRAM cells (Layer 1 Cell, Layer 2 Cell) in a two layer cross-point array, such as shown in FIG. 4D, but in a side view. Keeping the orientation of the MRAM layers the same in the Layer 1 Cell and the Layer 2 Cell, as depicted in FIG. 6A, allows the fabrication process to be the same for each layer. Whereas 6B has the memory cell inverted which allows the drive circuitry to work the same; e.g., BL goes Low to Read P2AP for each layer. FIGS. 6A and 6B show a lower first conducting line of word line 1 600, an upper first conducting line of word line 2 620, and an intermediate second conducting line of bit line 610. In these figures, all of these lines are shown running left to right across the page for ease of presentation, but in a cross-point array they would be more accurately represented as in the oblique view of FIG. 4D where the word lines, or first conducting lines or wires, run in one direction parallel to the surface of the underlying substrate and the bit lines, or second conducting lines or wires, run in a second direction parallel to the surface to the substrate that is largely orthogonal to the first direction. The MRAM memory cells are also represented in a simplified form, showing only the reference layer, free layer, and the intermediate tunnel barrier, but in an actual implementation would typically include the additional structure described above with respect to FIG. 5.

An MRAM element 602 including free layer 601, tunnel barrier 603, and reference layer 605 is formed above the threshold switching selector 609, where this series combination of the MRAM element 602 and the threshold switching selector 609 together form the layer 1 cell between the bit line 610 and word line 1 600. The series combination of the MRAM element 602 and the threshold switching selector 609 operate largely as described above when the threshold switching selector 609 is turned on. Initially, though, the threshold switching selector 609 needs to be turned on by applying a voltage above the threshold voltage $V_{th}$ of the threshold switching selector 609, and then the biasing current or voltage needs to be maintained high enough above the holding current or holding voltage of the threshold switching selector 609 so that it stays on during the subsequent read or write operation.

On the second layer, an MRAM element 612 includes free layer 611, tunnel barrier 613, and reference layer 615 is formed above the threshold switching selector 619, with the series combination of the MRAM element 612 and the threshold switching selector 619 together forming the layer 2 cell between the bit line 610 and word line 2 620. The layer 2 cell will operate as for the layer 1 cell, although the lower conductor now corresponds to a bit line 610 and the upper conductor is now a word line, word line 2 620. Additional paired layers may similarly share another bit line between them, having a pattern of WL1, BL1, WL2; WL3, BL2, WL4; or have separate bit lines in a pattern such as WL$_1$, BL$_1$, WL2, BL2. Or separate bit lines in a pattern of WL1, BL1, BL2, WL2.

In the embodiment of FIG. 6A, the threshold switching selector 609/619 is formed below the MRAM element 602/612, but in alternate embodiments the threshold switching selector can be formed above the MRAM element for one or both layers. The MRAM memory cell is directional. In FIG. 6A, the MRAM elements 602 and 612 have the same orientation, with the free layer 601/611 above (relative to the unshown substrate) the reference layer 605/615. Forming the layers between the conductive lines with the same structure can have a number of advantages, particularly with respect to processing as each of the two layers, as well as subsequent layers in embodiments with more layers, can be formed according to the same processing sequence.

FIG. 6B illustrates an alternate embodiment that is arranged similarly to that of FIG. 6A, except that in the layer 2 cell the locations of the reference layer and free layer are reversed. More specifically, between word line 1 650 and bit line 660, as in FIG. 6A the layer cell 1 includes an MRAM element 1 having a free layer 651 formed over tunnel barrier 653, that is turn formed over the reference layer 655, with the MRAM element 652 formed over the threshold switching selector 659. The second layer of the embodiment of FIG. 6B again has an MRAM element 662 formed over a threshold switching selector 669 between the bit line 660 and word line 2 670, but, relative to FIG. 6A, with the MRAM element 662 inverted, having the reference layer 661 now formed above the tunnel barrier 663 and the free layer 665 now under the tunnel barrier 663. Alternatively, the configuration of MRAM element 662 may be used for the Layer 1 cell and the configuration of MRAM cell 652 may be used for the Layer 2 cell.

Although the embodiment of FIG. 6B requires a different processing sequence for the forming of layers, in some embodiments it can have advantages. In particular, the directionality of the MRAM structure can make the embodiment of FIG. 6B attractive since when writing or reading in the same direction (with respect to the reference and free layers) the bit line will be biased the same for both the lower layer and the upper layer, and both word lines will be biased the same. For example, if both layer 1 and layer 2 memory cells are sensed in the P2AP direction (with respect to the reference and free layers), the bit line layer 660 will be biased such as in the P2AP direction, the bit line 660 is biased low (e.g., 0V) for both the upper and lower cell, with word line 1 650 and word line 2 670 both biased to a higher voltage level. Similarly, with respect to writing, for writing to the high resistance AP state the bit line 660 is biased low (e.g., 0V) for both the upper and lower cell, with word line 1 650 and word line 2 670 both biased to a higher voltage level.

To either read data from or write data to an MRAM memory cell involves passing a current through the memory cell. In embodiments where a threshold switching selector is placed in series with the MRAM element, before the current can pass through the MRAM element the threshold switching selector may be turned on by applying a sufficient voltage across and current through the series combination of the threshold switching selector and the MRAM element.

Figure 7:
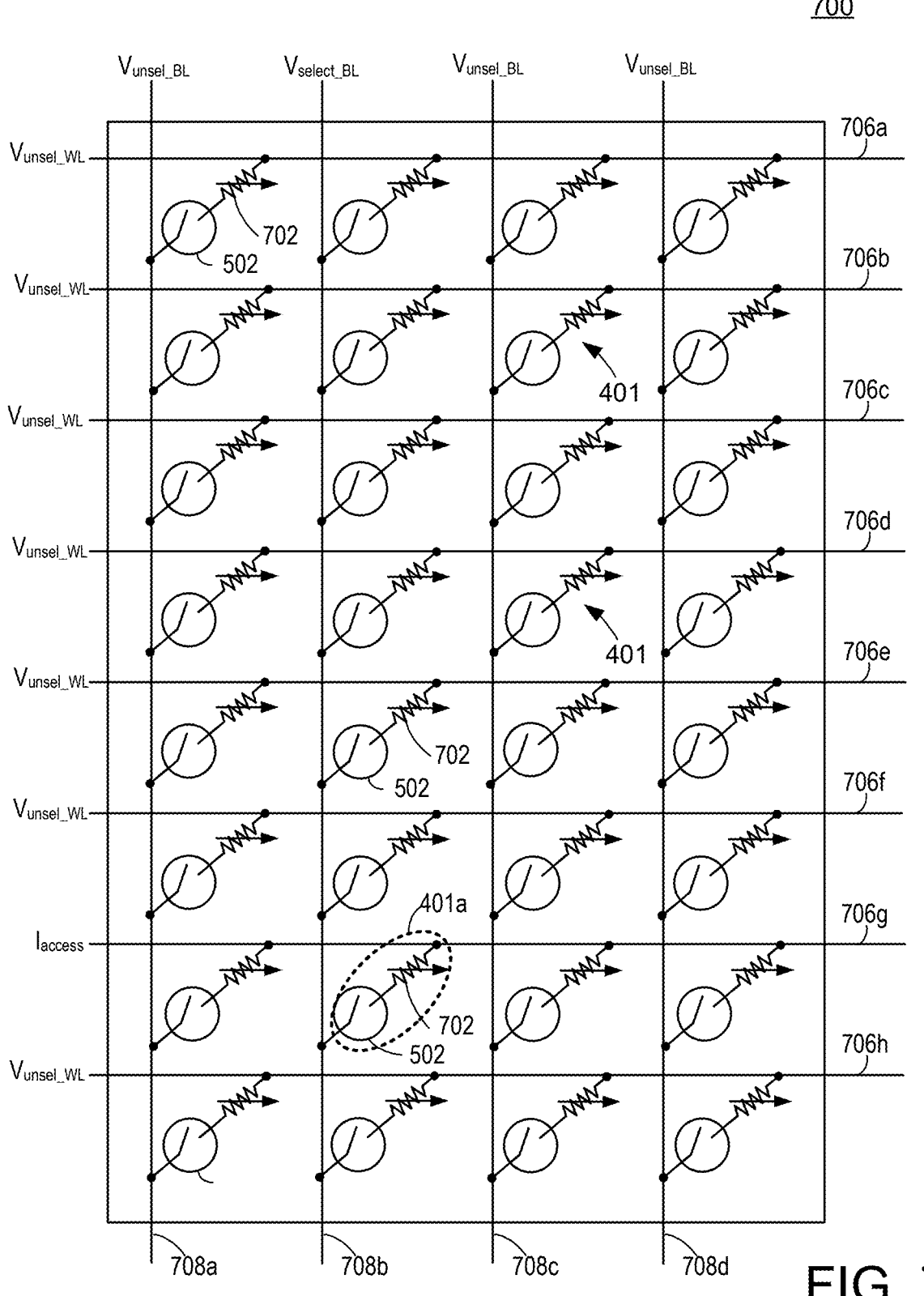
FIG. 7 depicts an embodiment of a memory array having a cross-point architecture that is accessed using a forced-current approach.

FIG. 7 depicts an embodiment of a memory array 700 having a cross-point architecture. The memory array 700 may be included in memory structure 202 of FIG. 2 or 3B. The array 700 has a set of first conductive lines 706a-706h and a set of second conductive lines 708a-708d. In one embodiment, the set of first conductive lines 706a-706h are word lines and the set of second conductive lines 708a-708b are bit lines. For ease of discussion, the set of first conductive lines 706a-706h may be referred to as word lines and the set of second conductive lines 708*a*-708*b* may be referred to as bit lines. However, the set of first conductive lines 706*a*-706*h* could be bit lines and the set of second conductive lines 708*a*-708*b* could be word lines.

The memory array 700 has a number of programmable resistance memory cells 401. Each memory cell 401 is connected between one of the first conductive lines 706 and one of the second conductive lines 708 (e.g., at the cross point of one of the first conductive lines 706 and one of the second conductive lines 708). In one embodiment, each memory cell 401 has a magnetoresistive random access memory (MRAM) element in series with a threshold switching selector. The threshold switching selector 502 is configured to become conductive with lower resistance in response to application of a voltage level exceeding a threshold voltage of the threshold switching selector 502, and remains conductive with lower resistance until the current through the switching selector 502 is reduced below the selector holding current, Ihold. The threshold switching selector 502 may be a two terminal device. In an embodiment, the threshold switching selector 502 comprises an OTS.

For purpose of discussion, memory cell 401*a* is being selected for access. This could be a read or a write access. Selected memory cell 401*a* is at the cross-point of selected word line 706*g* and selected bit line 708*b*. A selected memory cell means a memory cell that is selected for a memory operation such as a read or write. A selected memory cell is connected between a selected word line and a selected bit line. To select a memory cell 401, a select voltage ($V_{select\_BL}$) such as near ground is provided to the selected bit line (e.g., bit line 708*b*) and an access current ($I_{access}$) is driven (or forced) to a selected word line (e.g., word line 706*g*). A selected word line means that the word line is connected to at least one selected memory cell. The selected word line will typically be connected to one or more unselected memory cells. A selected bit line means that the bit line is connected to at least one selected memory cell. The selected bit line will typically be connected to one or more unselected memory cells.

In one embodiment, $V_{select}$ BI, has an adequate magnitude such that the threshold switching selector 502 in a selected memory cell will turn on, assuming that $I_{access}$ is applied to the selected word line with adequate compliance voltage relative to the BL voltage. For example, $V_{select}$ BI, may be approximately 0V. On the other hand, $V_{unsel\_BL}$, has a magnitude such that the threshold switching selector 502 in an unselected memory cell will not turn on, for example $V_{unsel\_BL}$ may be approximately 1.65V if the positive power supply is 3.3V. Access current ($I_{access}$) is driven through at least a portion of selected word line 706*g* after the OTS is turned on. This access current may also flow through the selected memory cell 401*a* and in a portion of selected bit line 708*b* after the OTS is turned on. Such a selected WL may, for example, be driven high by 15 µA to read or 30*u* A to write by a current source with compliance voltage of, for example, 3.3V. To write the opposite polarity, the selected word line is forced, for example, with –30 µA and the selected bit line to near 3.3V.

The other memory cells are not selected for access (i.e., are unselected memory cells). An unselected memory cell means that the memory cell is not presently selected for access (e.g., read or write). An unselected word line is connected only to unselected memory cells. An unselected bit line is connected only to unselected memory cells. Word lines and bit lines that are not selected are referred to as unselected word lines or unselected bit lines, respectively. In one embodiment, a word line or bit line may be unselected by forcing them to an unselect voltage, such as Vmid, for example 1.65V, at approximately one half the drive compliance voltage; e.g., 3.3V. An unselect voltage ($V_{unsel\_BL}$) is provided to the unselected bit lines (e.g., bit lines 708*a*, 708*c*, 708*d*). An unselect voltage ($V_{unsel\_WL}$) such as Vmid is provided to the unselected word lines (e.g., word lines 710*a*, 710*b*, 710*c*, 710*d*, 710*e*, 710*f*, and 710*h*). $I_{access}$ could flow in either direction through the selected word line (as well as the selected bit line). In one embodiment, no current other than leakage is forced through unselected word lines (e.g., 706*a*, 706*b*, 706*c*, 706*d*, 706*e*, 706*f*, and 706*h*).

In the example of FIG. 7 there are more word lines than bit lines in the cross-point array. In another embodiment, there are more bit lines than word lines in the cross-point array. In another embodiment, the number of bit lines equals the number of word lines in the cross-point array. In the example of FIG. 7 there are twice as many word lines as bit lines in the cross-point array; however, a different ratio could be used. Thereby, different tile sizes may be realized. For example, a tile may have 1024 BL by 2048 WL, which may be composed into a module of 2048×4096 cells by center driving the WL and BL between the four tiles. In one embodiment, read is performed on a group of memory cell by, for example, selecting one memory cell in each of a number of tiles. In some embodiments, more than one memory cell from a tile may be selected for a read.

In some embodiments, a current-force approach is used to access memory cells in a cross-point memory array. A threshold switching selector may be used in series with the programmable resistance memory element. The threshold switching selector may be connected in series with the programmable resistance memory element between the word line and the bit line. Hence, any voltage across the threshold switching selector will reduce the voltage across the programmable resistance memory element. Typically, there will be some variation in the offset or hold voltage between the threshold switching selectors. A current-force approach may help to mitigate offset voltage variation between threshold switching selectors or memory element voltage from critical dimension (CD) variation to help minimize the selected cell current variation cell to cell.

Figure 8:
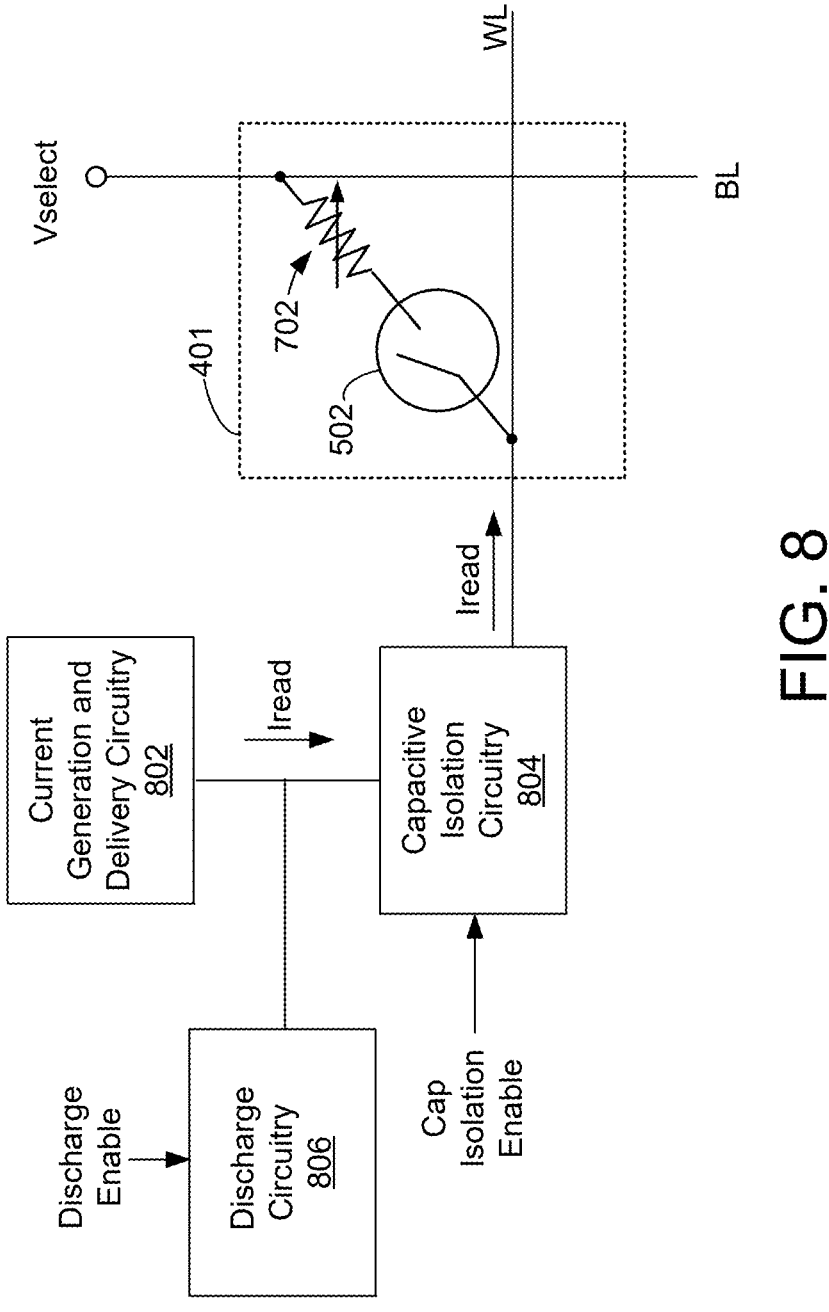
FIG. 8 is a diagram of one embodiment of a system for reading a memory cell having a threshold switching selector.

FIG. 8 is a diagram of one embodiment of a system for reading a memory cell having a threshold switching selector in series with a programmable resistance memory element. The system has a current generation and delivery circuitry 802, capacitive isolation circuitry 804, and discharge circuitry 806. In an embodiment, the current generation and delivery circuitry 802, capacitive isolation circuitry 804, and discharge circuitry 806 are part of the row control circuitry 220 (see FIG. 2 or 3). The row control circuitry 220 may also include sense amplifiers 228, but the sense amplifier is not depicted in FIG. 8. One memory cell 401 of the many memory cells in a cross-point array is depicted. The memory cell 401 has a programmable resistance memory element 702 in series with a threshold switching selector 502. In one embodiment, the memory cell 401 is an MRAM cell in which the programmable resistance memory element 702 is a magnetoresistance memory element and the threshold switching selector 502 is an OTS. However, the memory cell could be a PCM cell, a ReRam cell, an FeRam cell, etc. The threshold switching selector 502 is not required to be an OTS. The threshold switching selector 502 could instead be a Volatile Conductive Bridge (VCB), Metal-Insulator-Metal (MIM), or other material that provides a highly non-linear dependence of current on select voltage. The voltage $V_{select}$ on the bit line (BL) is a voltage having a suitable magnitude to select the memory cell. In one embodiment, $V_{select}$ to the bit line is near 3.3V. In another embodiment, $V_{select}$ to the bit line is near 0V.

The current generation and delivery circuitry 802 contains a number of current sources, current drivers, and associated electrical lines. The current sources may include read current sources and write current sources. FIG. 8 shows an example in which one of a read current $I_{read}$ is driven to the word line (WL). In an embodiment, there is a fixed magnitude read current source of 15 μA, a fixed magnitude read current source of −15 μA, a fixed magnitude write current source of 30 μA, and a fixed magnitude write current source of −30 μA. The current generation and delivery circuitry 802 contains a number of current drivers and other transistors to provide the pertinent current to the selected word line. The read current $I_{read}$ could have a positive magnitude or negative magnitude with reference to the direction of the current arrow below $I_{read}$ in FIG. 8. Thus, the term "current source" will be used herein regardless of the direction of current flow at the output of the current source. The terms "sourcing a current" and "sinking a current" are sometimes used by those of ordinary skill in the art to differentiate between the direction of current flow. The current generation and delivery circuitry 802 may "source" a current or "sink" a current with respect to direction of current flow. Furthermore, a phrase such as "providing a current" or "driving a current" includes the output current $I_{read}$ being both positive (e.g., "sourcing a current") and negative (e.g., "sinking a current").

In an embodiment, the current generation and delivery circuitry 802 provides a first write current to "set" the memory cell a second write current to "reset" the memory cell, wherein these two write currents have opposite polarities (i.e., positive and negative). During a read the current increases the voltage across the selected memory cell until the threshold switching selector 502 switches on. In an embodiment, the read current has a positive polarity and charges up the selected word line (with the bit line at a lower voltage) until the threshold switching selector 502 switches on. In an embodiment, the read current has a negative polarity similar to the reset or set current and lowers the selected word line voltage (with the selected bit line at a higher voltage) until the threshold switching selector 502 switches on. After the threshold switching selector 502 switches on, $I_{read}$ is driven through the memory cell 401.

The current generation and delivery circuitry 802 has a capacitance which can impact the programmable resistance memory cell 401. Herein, this will be referred to as the "circuit capacitance". The capacitive isolation circuitry 804 is able to isolate the memory cell 401 from the circuit capacitance. The capacitive isolation circuitry 804 may also isolate the memory cell 401 from the capacitance associated with a sense amplifier. In an embodiment, the capacitive isolation circuitry 804 contains one or more transistors that provide the read current to the selected word line. In an embodiment, these transistor(s) serve as decode transistors. In an embodiment, the memory system controls the resistance of these one or more transistors in order to provide the capacitive isolation. In an embodiment, the transistors are only weakly on (higher resistance) to provide capacitive isolation and more strongly on (lower resistance) for a default mode without the capacitive isolation. The memory cell 401 is read in the default mode without the capacitive isolation. In an embodiment, the capacitive (cap) isolation enable signal is used to select either the capacitive isolation mode or the default mode. Note that the read current may be provided to the selected word line in either mode.

The capacitive isolation circuitry 804 may be operated in the capacitive isolation mode when the read current is charging the word line to turn on the threshold switching selector 502 and for a period time after the threshold switching selector switches on. A snapback current may occur when the threshold switching selector 502 switches on and there is a rapid voltage drop across the memory cell 401. The snapback current is proportional to capacitance in circuitry adjacent to the memory array. Isolating the memory cell 401 from this circuit capacitance reduces the snapback current. However, at some point the capacitive isolation is removed in order to read the memory cell. The resistance of the read path should be low in order to improve read accuracy. As noted above, transistors in the capacitive isolation circuitry 804 may be operated at a higher resistance in the capacitive isolation mode. However, for better read accuracy it is desirable to reduce the resistance of these transistors.

Removing the capacitive isolation may itself cause another type of snapback current ("circuit snapback"), which could disturb the state of the memory cell 401. The discharge circuitry 806 provides a discharge pathway to prevent this circuit snapback current from disturbing the state of the memory cell 401. In an embodiment, the discharge circuitry 806 is activated during the time period in which the capacitive isolation mode is exited in order to prevent this circuit snapback current from disturbing the state of the memory cell 401. The discharge enable signal is used to control whether the discharge circuitry 806 is active. The discharge circuitry 806 is disabled prior to reading the memory cell 401. In an embodiment, the discharge circuitry 806 includes one or more capacitors that are used for charge sharing. In an embodiment, the discharge circuitry 806 includes one a voltage source that may provide, for example, a step voltage pulse. In an embodiment, the step voltage is a power source voltage.

Figures 9A, 9B:
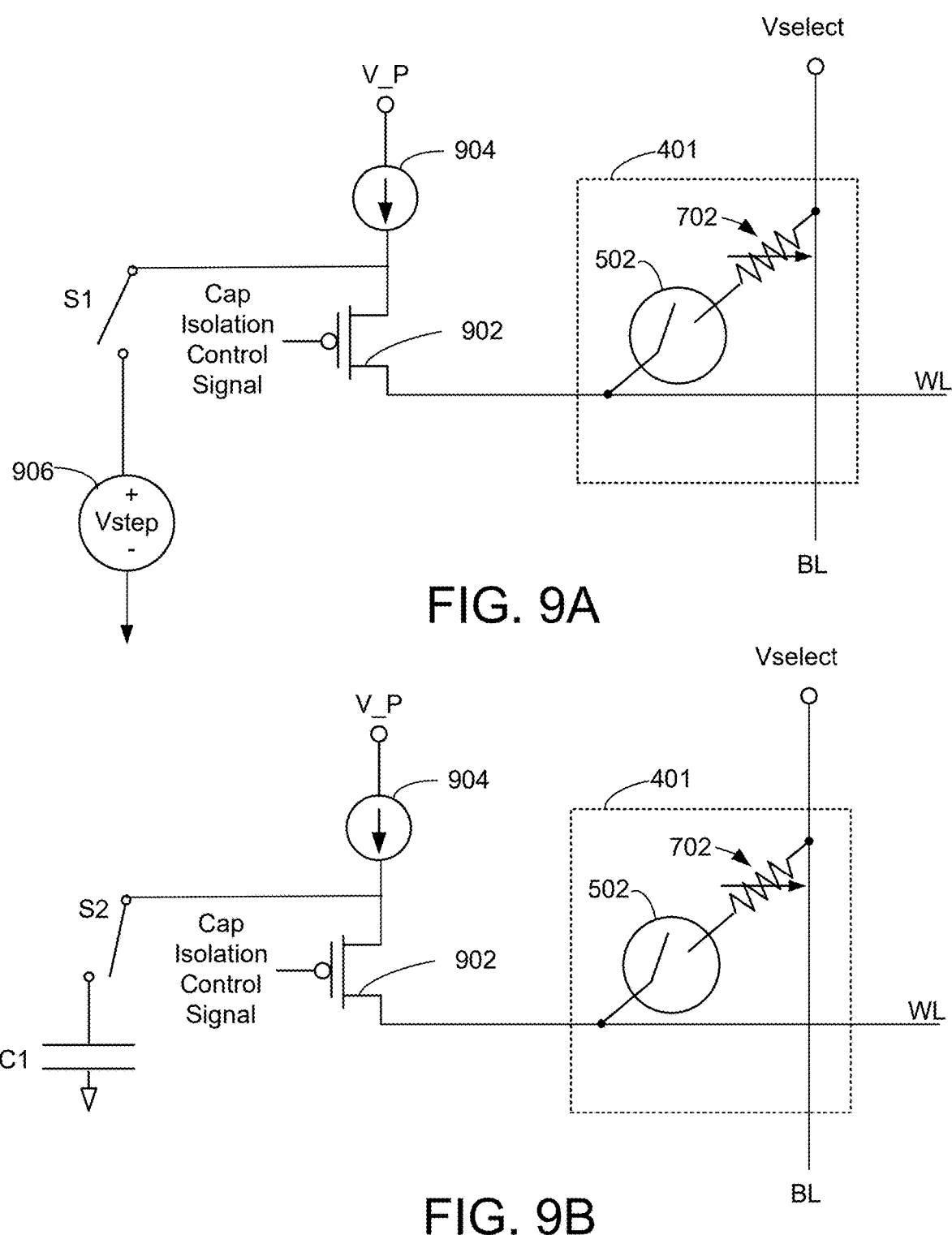
FIG. 9A is a simplified schematic diagram of an embodiment of circuitry for reading a memory cell.
FIG. 9B is a simplified schematic diagram of an embodiment of circuitry for reading a memory cell.

FIG. 9A is a simplified schematic diagram of an embodiment of circuitry for reading a memory cell. FIG. 9A provide some details of an embodiment of the system in FIG. 8. A read current source 904 provides a read current. In this example, the read current source 904 is connected to a voltage V_P, which could be about 3.3V as one example. To select the bit line (BL) the bit line may be set to ground, as one example. The read current is used in this example to charge up the voltage on the selected word line. The read current source 904 is within an embodiment of current generation and delivery circuitry 802. In this simplified diagram other elements such as current drivers are not depicted in FIG. 9A. PMOS decode transistor 902 is within one embodiment of capacitive isolation circuitry 804. The gate of PMOS decode transistor 902 is provided with cap isolation control signal to control whether the PMOS decode transistor 902 is in the default mode, capacitive isolation mode, or unselected. The PMOS decode transistor 902 is selected (on) to select the word line. In other words, the PMOS decode transistor 902 is selected (on) to connect the read current source to the selected word line. The PMOS decode transistor 902 is unselected (off) when the word line is not selected. The magnitude of the cap isolation control signal is used to control the overdrive of the PMOS decode transistor 902. The PMOS decode transistor 902 is only weakly on (high resistance) for the capacitive isolation mode. The PMOS decode transistor 902 is more strongly on (low resistance) for the default mode used during read. The step voltage source 906 and switch S1 are within one embodiment of discharge circuitry 806. In an embodiment, S1 is closed to enable the discharge circuitry 806 and open to disable the discharge circuitry 806.

FIG. 9B is a simplified schematic diagram of an embodiment of circuitry for reading a memory cell. FIG. 9B provide some details of another embodiment of the system in FIG. 8. The capacitor C1 and switch S2 are within one embodiment of discharge circuitry 806. In an embodiment, S2 is closed to enable the discharge circuitry 806 and open to disable the discharge circuitry 806.

Figure 10:
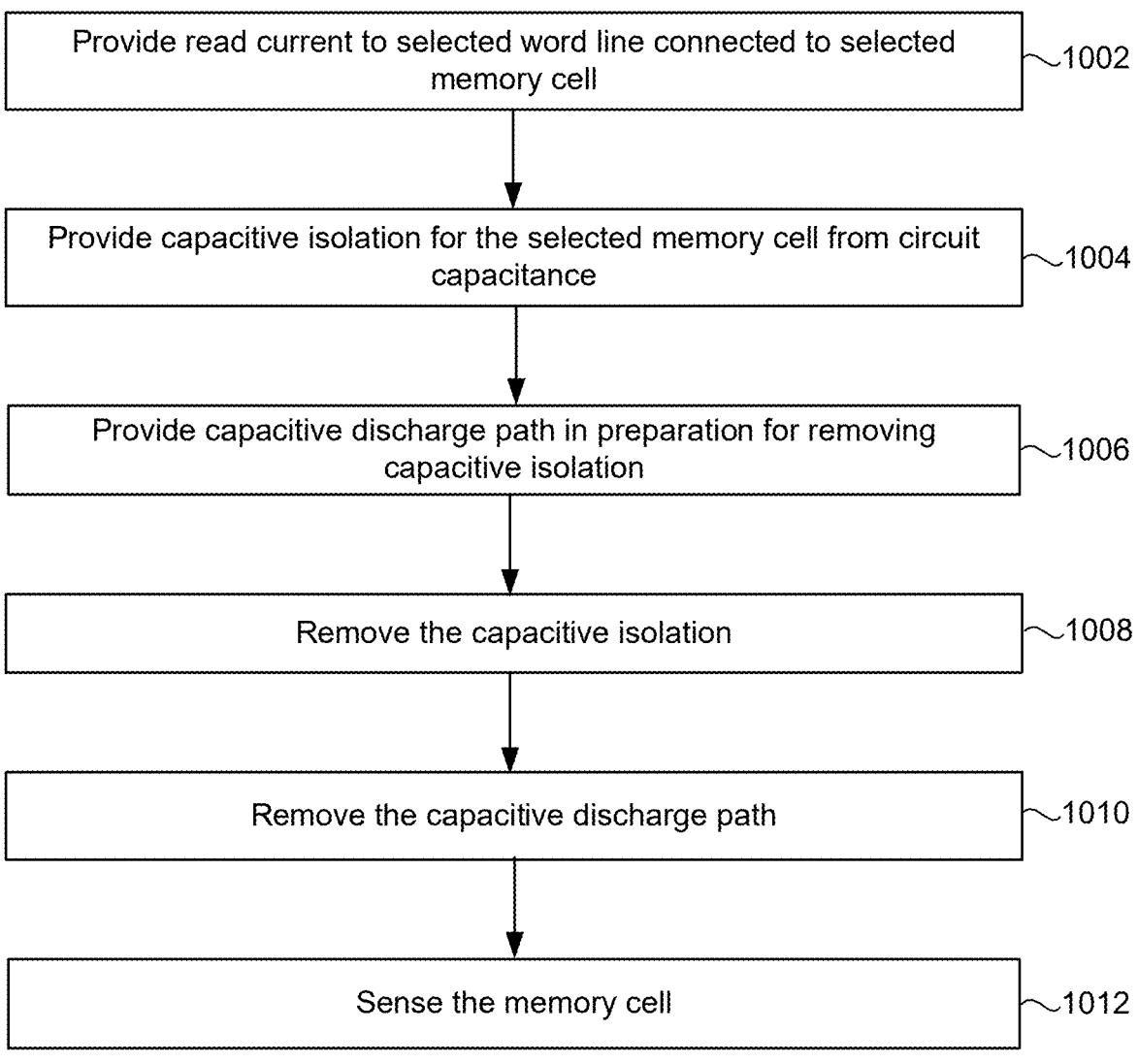
FIG. 10 is a flowchart of one embodiment of a process of reading a programmable resistance memory cell.

FIG. 10 is a flowchart of one embodiment of a process 1000 of reading a programmable resistance memory cell 401. The process 1000 may be used to read memory cells having a threshold switching selector 502 in series with a programmable resistance memory element 702. The process 1000 may improve read accuracy (bit error rate) by preventing the memory cell from inadvertently flipping its state prior to sensing the cell. In one embodiment, process 1000 is used in a midpoint read (also referred to as a globally referenced read for "direct cell read compared to reference voltage"). In one embodiment, process 1000 is used in a midpoint read (also referred to as a globally referenced read for "direct cell read compared to reference voltage"). In one embodiment, process 1000 is used in an SRR. The process 1000 may be performed by the system in FIG. 8, but is not limited thereto.

Step 1002 includes providing a read current to a selected word line connected to a selected memory cell. The read current is generated by a current source in current generation and delivery circuitry 802. The current generation and delivery circuitry 802 may reside in row control 220 with other circuitry such as sense amplifiers. A select voltage may be applied to a selected bit line while driving the read current to the selected word line. In one embodiment, the selected bit line is held at about 0V while a read current of about 15 μA is driven to the selected word line. In one embodiment, the selected bit line is held at about 3.3V while a read current of about −15 μA is driven to the selected word line.

Step 1004 include providing capacitive isolation for the selected memory cell from the circuit capacitance of the current generation and delivery circuitry 802. Step 1004 may include enabling the capacitive isolation circuitry 804 for the capacitive isolation mode. In an embodiment, the resistance of one or more transistors between the current source in current generation and delivery circuitry 802 and the selected memory cell is set to a high resistance level, but with the transistor weakly on. Therefore, the read current continues to be provided to the selected word line. Step 1004 may also provide capacitive isolation for the selected memory cell from other row control circuitry such as a sense amplifier.

Step 1006 includes providing a discharge path in preparation for removing the capacitive isolation. In an embodiment, the discharge circuitry 806 is enabled. In one embodiment, a capacitor (e.g., C1) is connected to a read path. In one embodiment, a voltage source (e.g., Vstep) is connected to the read path.

Step 1008 includes removing the capacitive isolation. Step 1004 may include setting the capacitive isolation circuitry 804 to the default mode. The discharge circuitry 806 remains enabled while the capacitive isolation is removed to prevent a potential snapback current from the removal of the capacitive isolation from disturbing the state of the memory cell 401.

Step 1010 includes removing the discharge path. In an embodiment, the discharge circuitry 806 is disabled.

Step 1012 includes sensing the memory cell. The memory cell is thus sensed with the discharge circuitry 806 disabled and with the capacitive isolation circuitry 804 in the default mode. Recall that in the default mode the one or more transistors that provide for the capacitive isolation have a low resistance (e.g., strongly on). In one embodiment, sensing is for a Read1 of an SRR. In one embodiment, the sensing is for a Read2 of an SRR after the write to a particular state. In one embodiment, the sensing is for a globally referenced read.

Figure 11A:
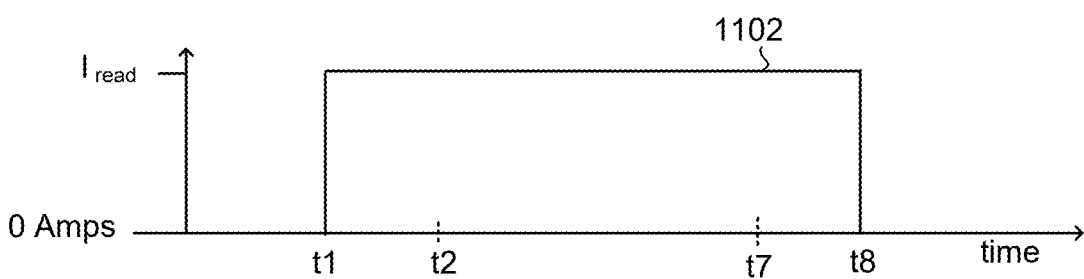
FIGS. 11A, 11B, 11C, and 11D depict timing of signals during an embodiment of read with snapback protection with capacitive isolation.
Figure 11B:
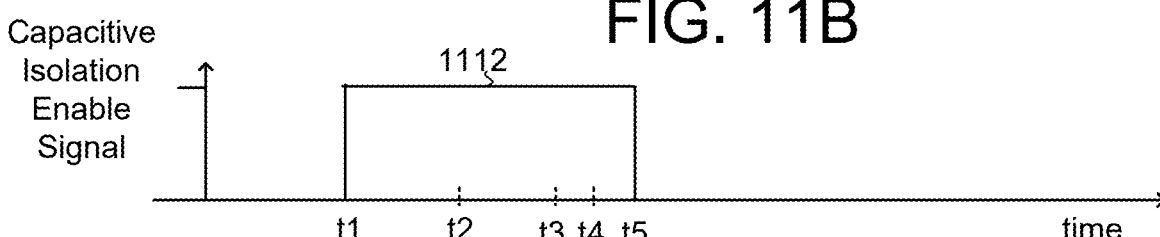
Figure 11C:
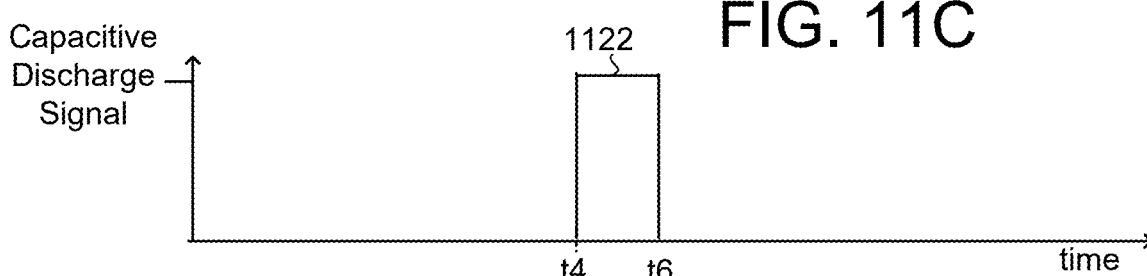
Figure 11D:
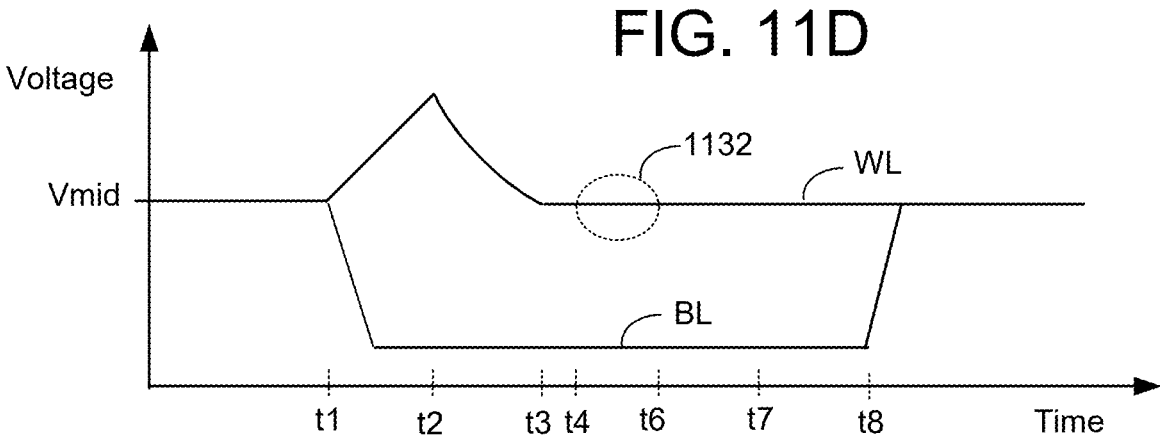

FIGS. 11A, 11B, 11C, and 11D depict timing of signals during an embodiment of read with snapback protection with capacitive isolation. FIG. 11A shows timing for one embodiment of the read current, which is applied to the selected word line. The read current (plot 1102) is applied to the selected word line between time t1 and t8. FIG. 11B shows timing for one embodiment of a capacitive isolation enable signal. The capacitive isolation enable signal is active between t1 and t5 (plot 1112). Capacitive isolation is provided while the capacitive isolation enable signal is active. The capacitive isolation may be used to isolate the selected word line from the capacitance of the current generation and delivery circuitry 802. FIG. 11C shows timing for one embodiment of a capacitive discharge signal. The capacitive discharge signal is active between t4 and t6 (plot 1122). The discharge circuitry 806 is enabled while the capacitive discharge signal is active. Note that the capacitive discharge signal is active during the period in which the capacitive isolation is removed. FIG. 11D depicts voltages on the selected word line and the selected bit line. Prior to t1, both the selected word line and the selected bit line are driven to Vmid by the memory system. The bit line voltage may be brought down to ground after t1. The word line voltage increases between t1 and t2 due to the read current. At t2 the threshold switching selector switches on. The resistance of the threshold switching selector 502 may reduce rapidly when it switches on. A significant snapback current may result due to voltage change and circuit capacitance. This snapback current could potentially flip the state of the memory cell prior to read. However, in an embodiment, capacitive isolation is provided while the snapback current is present. The capacitive isolation may reduce the magnitude of the snapback current. By t3 the word line voltage has settled down to a stable voltage. Therefore, the capacitive isolation may be removed. However, prior to removing the capacitive isolation the discharge circuitry 806 is enabled at t4. The region 1132 highlighted in FIG. 11D indicates the time period between t4 and t6 for which the discharge circuitry 806 is enabled. Referring back to FIG. 11B, the capacitive isolation is removed at t5. The removal of the capacitive isolation at t5 could itself create a circuit snapback current that could potentially flip the state of the memory cell. However, the discharge circuitry 806 provides a pathway to discharge such a circuit snapback current to thereby prevent the memory cell from inadvertently flipping its state. At to the discharge circuitry 806 may be disabled. At t7 the memory cell may be read. Thus, the memory cell is read with the discharge circuitry 806 and the capacitive isolation both disabled. At t8 the bit line and word line voltages may be brought back to Vmid.

Figure 12A:
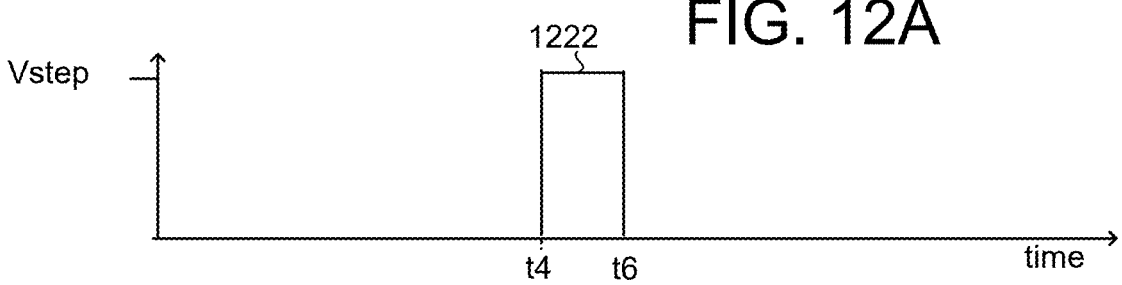
FIGS. 12A and 12B are timing diagrams of signals during an embodiment of read with the discharge circuitry including voltage source.
Figure 12B:
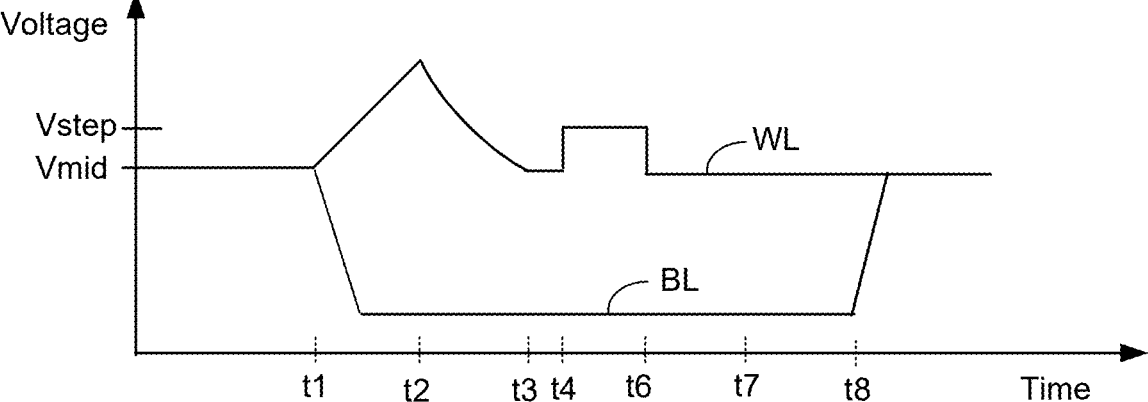

In one embodiment the discharge circuitry 806 includes a voltage source that is connected to the read path to provide the discharge. FIGS. 12A and 12B are timing diagrams of signals during an embodiment of read with the discharge circuitry 806 including voltage source. The read current and capacitive isolation may be timed as in FIGS. 11A and 11B, respectively. FIG. 12A shows timing of a step voltage Vstep. The step voltage 906 may be connected to the read path from t4 to t6 (plot 1222). Refer back to FIG. 9A for an example of connecting Vstep 906 to the read path using S1. FIG. 12B shows timing of voltages to the word line and bit line. The timings are similar to FIG. 11D; however, in FIG. 12B Vstep is applied to the word line between t4 and t6.

Figure 13A:
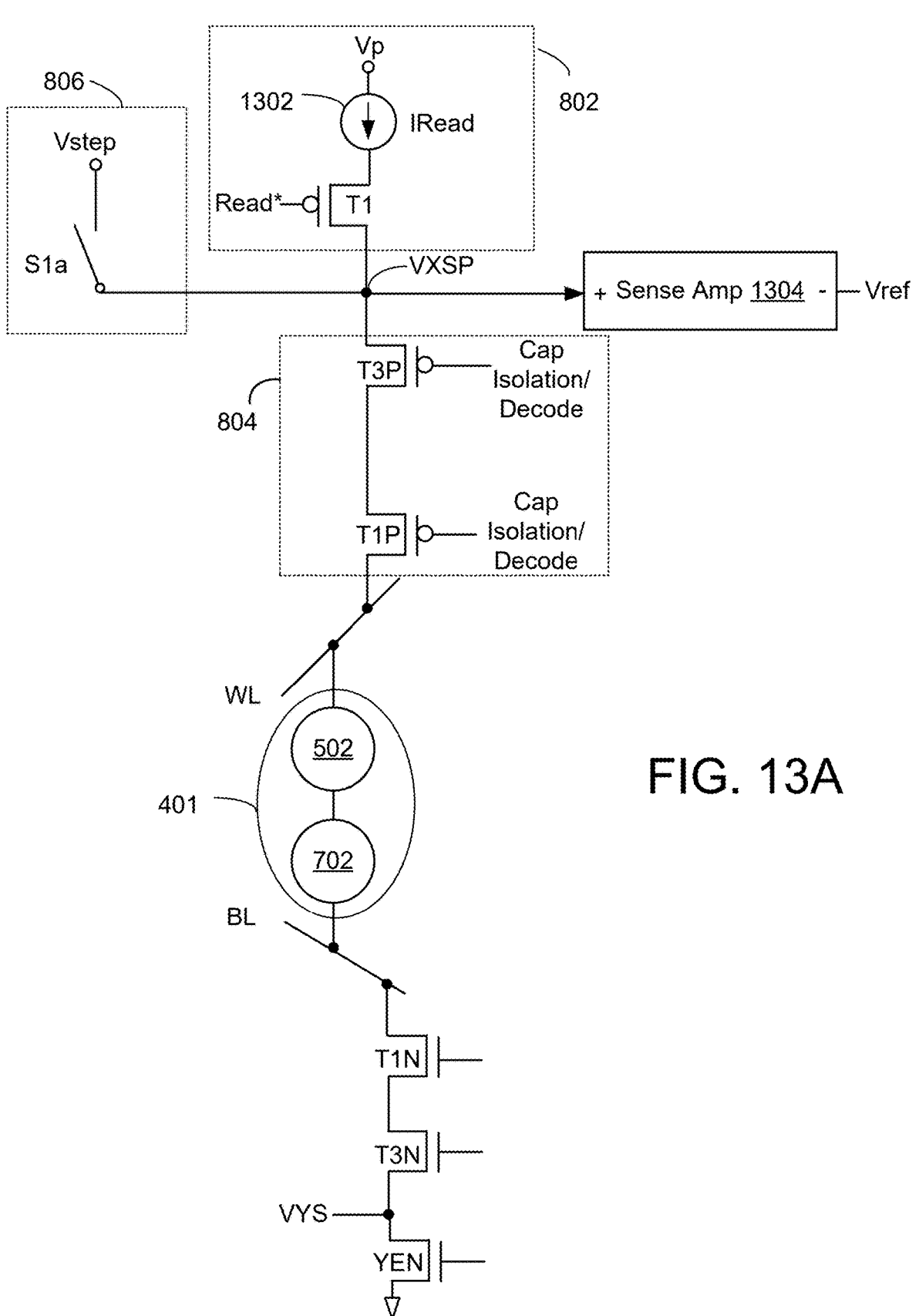
FIG. 13A is a schematic diagram of one embodiment of a read path in which discharge circuitry includes a voltage source.

FIG. 13A is a schematic diagram of one embodiment of a read path. The read path includes a current source 1302, driver transistor T1, word line decode transistors (T3P, TIP), the word line (WL), the memory cell 401, the bit line (BL), and bit line decode transistors (TIN, T3N). The word line decode transistors (T3P, TIP) are within one embodiment of capacitive isolation circuitry 804. The word line decode transistors (T3P, TIP) serve as both decoders and to provide the capacitive isolation. Therefore, the signal to their control gates is referred to as "Cap Isolation/Decode". The current source 1302 and driver transistor T1 are within one embodiment of current generation and delivery circuitry 802. Note that current generation and delivery circuitry 802 has other current sources and transistors, which are not depicted in FIG. 13A. The step voltage source and switch S1a are within one embodiment of discharge circuitry 806. FIG. 13A also depicts a sense amplifier (amp) 1304. The non-inverting input (+) of the sense amp 1304 is connected to node VXSP. The inverting input (−) of the sense amp 1304 is provided with a reference voltage (Vref). Note that the capacitive isolation may also be used to isolate capacitance of the sense amplifier 1304 from the selected memory cell 401. The current generation and delivery circuitry 802, capacitive isolation circuitry 804, and discharge circuitry 806, and sense amp 1304 may form part of the row control 220 (see FIG. 2, 3).

The read path has a Vp positive power supply, such as about 3.3V. The read current source 1302 is connected to the power supply (Vp) and supplies $I_{read}$ to the memory cell. The read current may be enabled by taking Read*low to turn on transistor T1. The output of T1, which is node VXSP, also drives the non-inverting input (+) of the differential sense amp 1304. The inverting input (−) of the differential sense amp 1304 is provided with a reference voltage (Vref). For a globally referenced read Vref is a global reference voltage. For a SRR Vref is derived from a previous sense operation by, for example, bumping voltage from Read 1 by 150 mV.

P-channel transistor T3P serves as a global WL decoder, which may be selected when the gate of T3P is low by signal Cap Isolation/Decode. P-channel transistor TIP serves as a local WL decoder, which may be selected when the gate of TIP is low by signal Cap Isolation/Decode. P-channel transistor T3P may serve as a driver to the selected WL. However, note that there may be two selection modes for TP3 and TIP: 1) normal mode (lower resistance) and 2) capacitive isolation mode (higher resistance). Thus, TP3 and TIP may be only weakly on for the capacitive isolation mode. However, for the normal mode TP3 and TIP may be on more strongly.

The memory cell 401 is connected between the WL and the BL. The memory cell (or bit) has a threshold switching selector 502 and a memory element 702. The selected WL may be 1 of N WLs in an array. The BL may be 1 of M BLs in an array. The memory cell 401 may reside at a cross-point of the WL and the BL on a chip with one or more arrays. N-channel transistor TIN may serve as a local decode driver into the BL. The BL may be selected when TIN gate is high, such as when driven by a binary decoder address signal. N-channel transistor T3N may serve as a global decoder, which is selected when T3N gate is high, such as when driven by a binary decoder address signal. The output of T3N is VYS. A driver (YEN) is between VYS and a negative (i.e., negative relative to Vp) power supply (GND).

Operation of the read path may in one embodiment be as follows. Node VXSP, the selected WL, the selected BL and VYS may be transistor pre-charged to Vmid during a standby phase. The desired WL line (1 of N) may be selected by turning off the pre-charge and applying a low voltage to the gates of transistors T3P and TIP. The BL line may be selected by turning off the pre-charge and applying a high voltage to the gates of transistors TIN and T3N (the gate voltages being referred to as decode address signals). The gate of transistor YEN may be taken high to connect node VYS to GND. $I_{read}$ may then be turned on and connected to VXSP by taking the gate of T1 low (e.g., Read*goes low). The BL may thus be rapidly pulled to GND by its active driver upon turn-on by YEN going H. The selected WL and VXSP are ramped towards Vp by $I_{read}$. In an embodiment, transistors T3P and TIP are only weakly on when charging up the selected WL in order to provide capacitive isolation for the selected memory cell from the current generation and delivery circuitry 802.

The threshold switching selector 502 turns on when the voltage on WL reaches an approximate voltage of $V_{th}$ (OTS) since I×R drops from leakage are relatively low. Here, $V_{th}$ (OTS) refers to the threshold switching voltage of the threshold switching selector 502, which may be but it not required to be an OTS. Then, the voltage on VXSP into the sense amp 806 settles back at Vfinal=Vread (final)=Voff (OTS)+Rpath×$I_{read}$. Here, Rpath includes WL and BL wire resistances, the address transistors (T3P, TIP, TIN, T3N) on each of the bit line and word line, and the bit line driver (YEN) to GND, as well as the resistance of the memory element itself 702. Here, Voff (OTS) refers to a voltage across the threshold switching selector 502 when it thresholded on. A snapback current may result due to the falling voltage on the word line when the threshold switching selector 502 turns on. However, the capacitive isolation reduces the magnitude of the snapback current to thereby reduce current flow through the memory element 702 when snapback current is present to reduce the probability of the memory element 702 from inadvertently flipping its state.

After the voltage on the word line stabilizes the capacitive isolation may be removed. However, in preparation for removing the capacitive isolation a discharge path is provided by the discharge circuitry 806. In an embodiment, the step voltage Vstep is connected to node VXSP on the read path, After connecting Vstep to node VXSP, the capacitive isolation may be removed. In an embodiment, the capacitive isolation is removed by changing the voltage to the gates of transistors T3P and TIP to turn on those transistors more strongly (more overdrive) in order to reduce the resistance of transistors T3P and TIP. After the capacitive isolation is removed, the discharge circuitry 806 may be disabled by opening switch S1a. Then, the memory cell 401 is sensed. The sense amp 806 compares Vfinal that is input on sense amp (+) to Vref on sense amp (−).

Figure 13B:
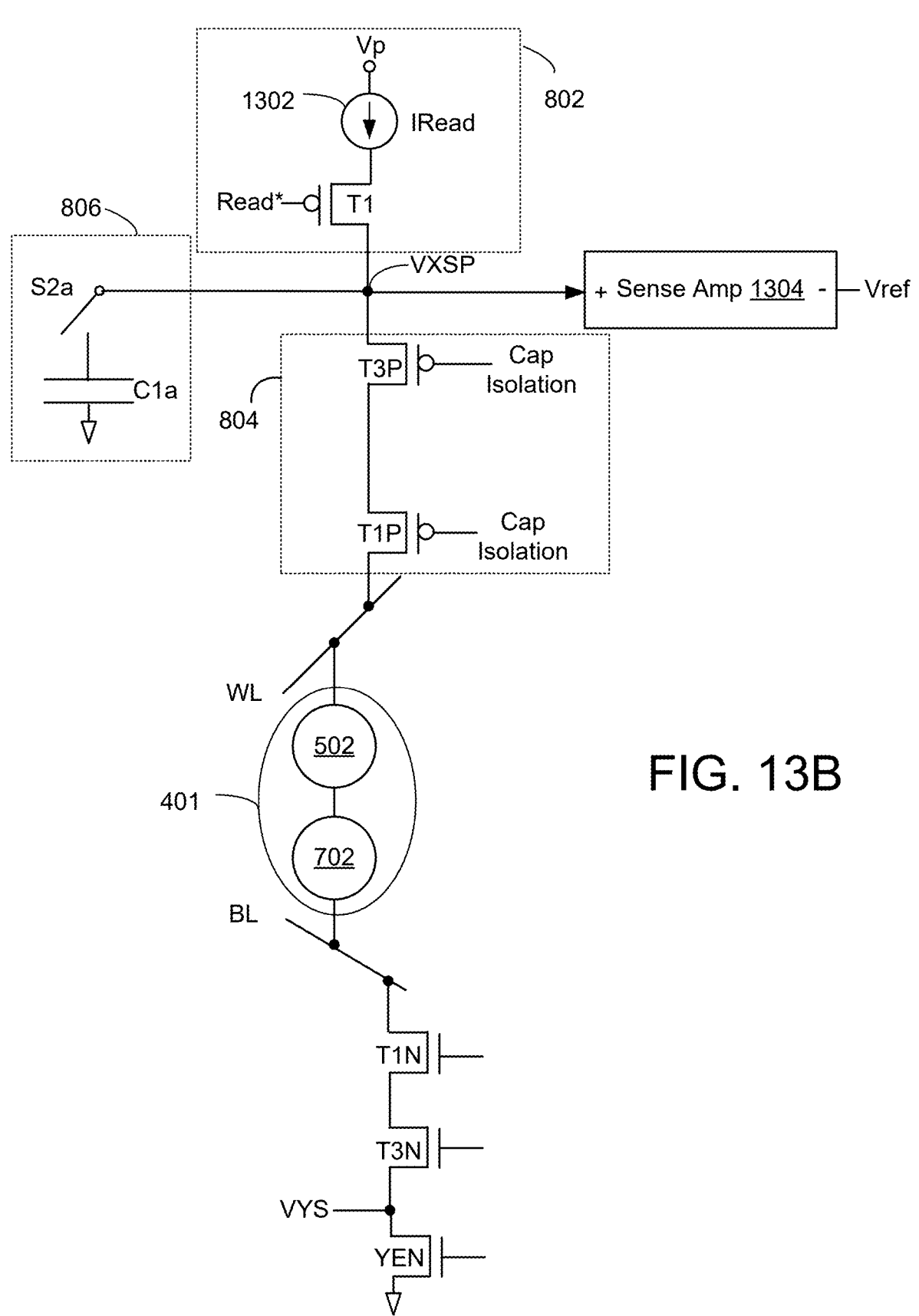
FIG. 13B depicts an alternative embodiment to the read path of FIG. 13A in which the discharge circuitry includes a capacitor.

FIG. 13B depicts an alternative embodiment to the read path of FIG. 13A in which the discharge circuitry 806 includes a capacitor C1a. Operation of the read path is similar to FIG. 13A. However, in FIG. 13B switch S2a is used to connect capacitor C1a to node VXSP to provide the discharge path.

Figure 14A:
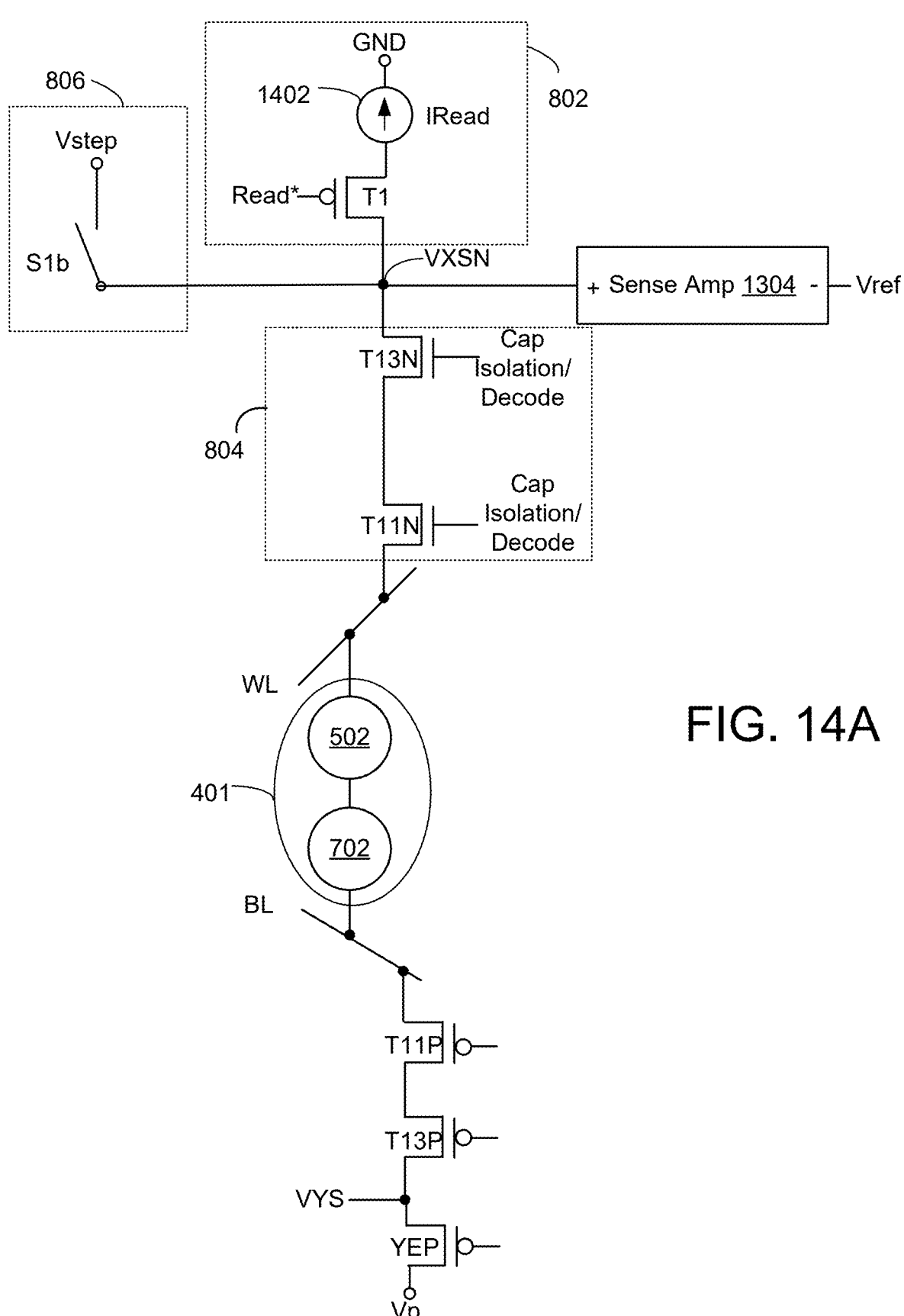
FIG. 14A is a schematic diagram of one embodiment of a read path to which discharge circuitry may be connected.

FIG. 14A is a schematic diagram of one embodiment of a read path to which discharge circuitry 806 may be connected. The read path is analogous to the read path in FIG. 13A, but the read current is directed away from the selected word line. The read path includes a current source 1402, driver transistor T1, word line decode transistors (T13N, T11N), the word line (WL), the memory cell 401, the bit line (BL), and bit line decode transistors (T11P, T13N). The word line decode transistors (T13N, T11N) are within one embodiment of capacitive isolation circuitry 804. The word line decode transistors (T13N, T11N) serve as both decoders and to provide the capacitive isolation. Therefore, the signal to their control gates is referred to as "Cap Isolation/Decode". The current source 1402 and driver transistor T1 are within one embodiment of current generation and delivery circuitry 802. Note that current generation and delivery circuitry 802 has other current sources and transistors, which are not depicted in FIG. 14A. The step voltage source and switch S1*b* are within one embodiment of discharge circuitry 806.

The read path has a Vp positive power supply connected to transistor YEP, such as about 3.3V. The read current source 1402 is connected to ground and supplies I$_{read}$ to the memory cell (current flows from bit line to word line when the threshold switching selector 502 is on). The read current may be enabled by taking Read*to low to turn on transistor T1. The output of T1, which is node VXSN, also drives the non-inverting input (+) of the differential sense amp 1304. The inverting input (−) of the differential sense amp 1304 is provided with a reference voltage (Vref). For a globally referenced read Vref is a global reference voltage. For a SRR Vref is derived from a previous sense operation by, for example, bumping voltage from Read 1 by 150 m V.

N-channel transistor T13N serves as a global WL decoder, which may be selected when the gate of T13N is high by signal Cap Isolation/Decode. N-channel transistor T11N serves as a local WL decoder, which may be selected when the gate of T11P is high by signal Cap Isolation/Decode. N-channel transistor T13N may serve as a driver to the selected WL. However, note that there may be two selection modes for T13N and T11N: 1) normal mode (lower resistance) and 2) capacitive isolation mode (higher resistance). Thus, T13N and T11N may be only weakly on for the capacitive isolation mode. However, for the normal mode T13N and T11N may be on more strongly.

The memory cell 401 is similar to the cell described in connection with FIG. 10. The BL may be selected when T11P gate is low, such as when driven by a binary decoder address signal from the from control circuit 804. P-channel transistor T13P may serve as a global decoder, which is selected when T13P gate is low, such as when driven by a binary decoder address signal. The output of T13P is VYS. A driver (YEP) is between VYS and a positive power supply (Vp), which may be about 3.3V.

Operation of the read path may in one embodiment be as follows. Node VXSP, the selected WL, the selected BL and VYS may be transistor pre-charged to Vmid during a standby phase. The desired WL line (1 of N) may be selected by turning off the pre-charge and applying a low voltage to the gates of transistors T13N and T11N. The BL line may be selected by turning off the pre-charge and applying a high voltage to the gates of transistors T11P and T13P. The gate of transistor YEP may be taken high to connect node VYS to GND. I$_{read}$ may then be turned on and connected to VXSP by taking the gate of T1 low (e.g., Read*goes low). The BL may thus be rapidly pulled to GND by its active driver upon turn-on by YEP going H. The selected WL and VXSP are ramped towards Vp by I$_{read}$. In an embodiment, transistors T11N and T13N are only weakly on when charging up the selected WL in order to provide capacitive isolation for the selected memory cell from the current generation and delivery circuitry 802.

The threshold switching selector 502 turns on when the voltage on WL reaches an approximate voltage of V$_{th}$ (OTS). A snapback current may result due to the falling voltage on the word line when the threshold switching selector 502 turns on. However, the capacitive isolation reduces the magnitude of the snapback current to thereby reduce current flow through the memory element 702 when snapback current is present to reduce the probability of the memory element 702 from inadvertently flipping its state.

After the voltage on the word line stabilizes the capacitive isolation may be removed. However, in preparation for removing the capacitive isolation a discharge path is provided by the discharge circuitry 806. In an embodiment, the step voltage Vstep is connected to node VXSP on the read path, After connecting Vstep to node VXSP, the capacitive isolation may be removed. In an embodiment, the capacitive isolation is removed by changing the voltage to the gates of transistors T13N and T11N to turn on those transistors more strongly (more overdrive) in order to reduce the resistance of transistors T13N and T11N. After the capacitive isolation is removed, the discharge circuitry 1304 may be disabled by opening switch S1*b*. Then, the memory cell 401 is sensed. The sense amp 1304 compares Vfinal that is input on sense amp (+) to Vref on sense amp (−).

Figure 14B:
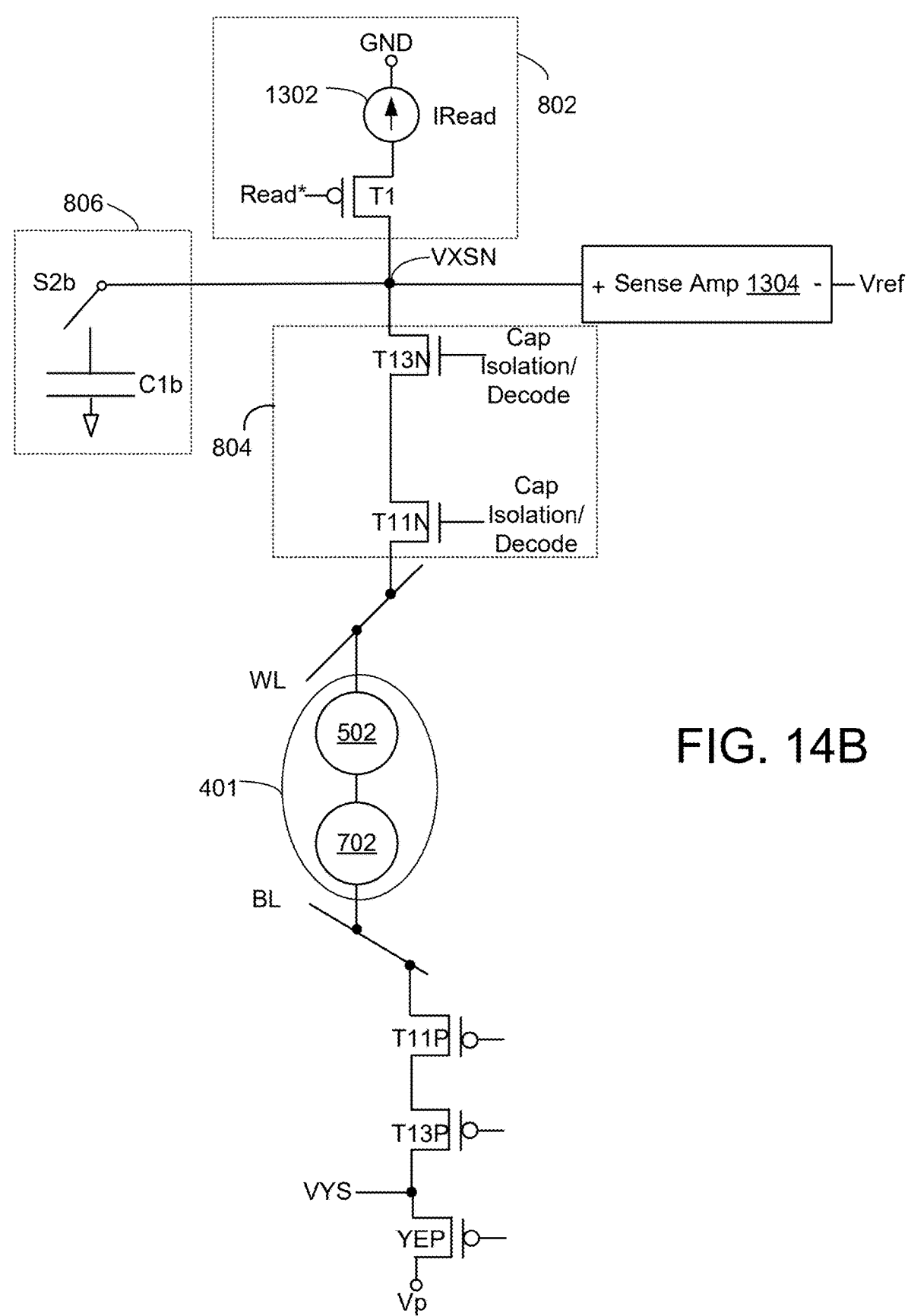
FIG. 14B depicts an alternative embodiment to the read path of FIG. 14A in which the discharge circuitry includes a capacitor.

FIG. 14B depicts an alternative embodiment to the read path of FIG. 14A in which the discharge circuitry 806 includes a capacitor C1*b*. Operation of the read path is similar to FIG. 14A. However, in FIG. 14B switch S2*b* is used to connect capacitor C1*b* to node VXSP to provide the discharge path.

Figure 15:
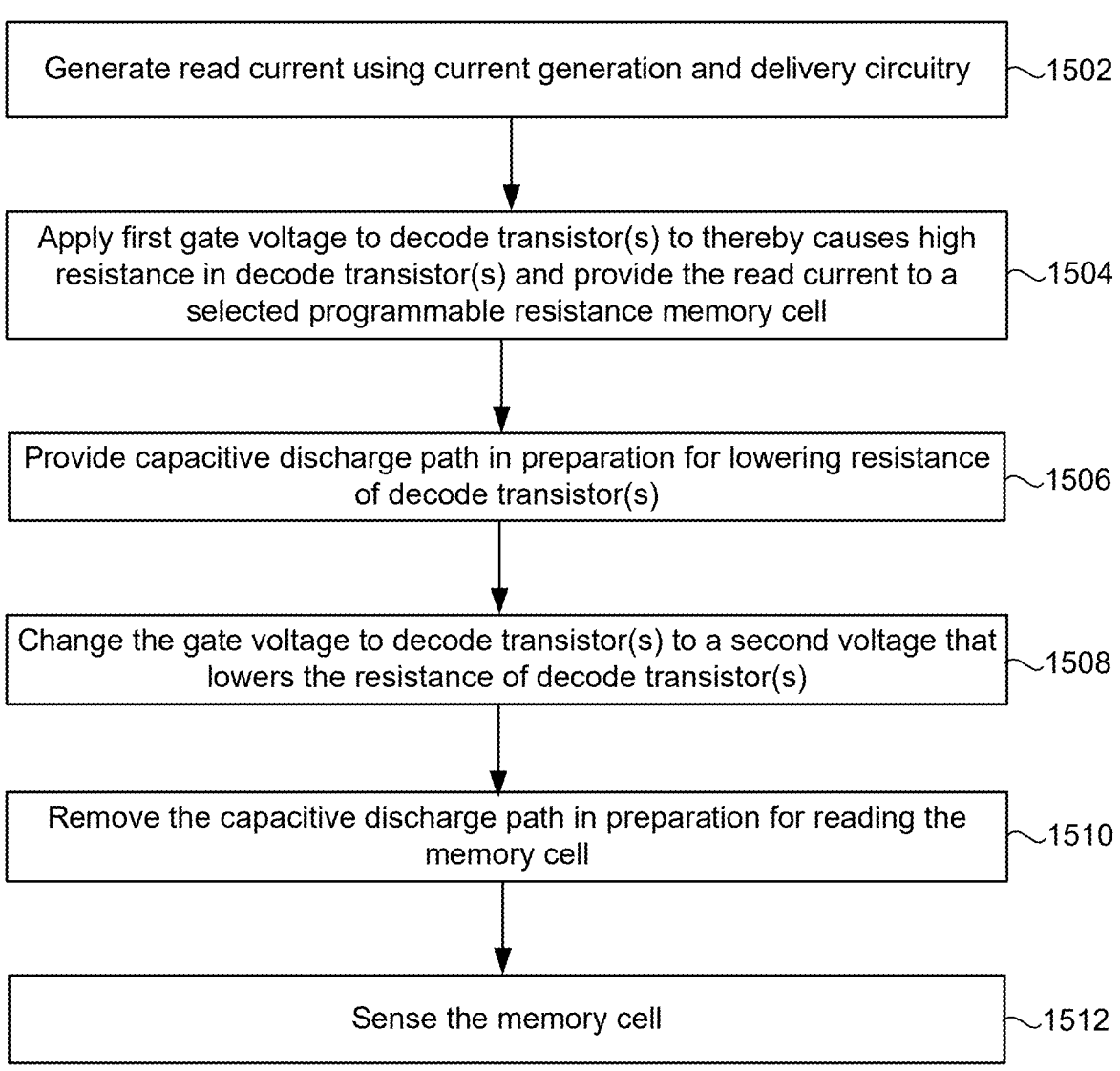
FIG. 15 is a flowchart of one embodiment of a process of reading a programmable resistance memory cell with discharge circuitry to mitigate circuit snapback current.

FIG. 15 is a flowchart of one embodiment of a process 1500 of reading a programmable resistance memory cell 401. The process 1500 may be used to read memory cells having a threshold switching selector 502 in series with a programmable resistance memory element 702. The process 1500 may improve read accuracy (bit error rate) by preventing the memory cell from inadvertently flipping its state prior to sensing the cell. In one embodiment, process 1500 is used in a midpoint read (also referred to as a globally referenced read for "direct cell read compared to reference voltage"). In one embodiment, process 1000 is used in a midpoint read (also referred to as a globally referenced read for "direct cell read compared to reference voltage"). In one embodiment, process 1000 is used in an SRR. The process 1000 may be performed by the system in FIG. 8, but is not limited thereto.

Step 1502 includes generating a read current using current generation of delivery circuitry 802. Step 1504 includes applying a first gate voltage to decode transistor(s) to thereby cause a high resistance in the decode transistor(s) and to provide the read current to a selected programmable resistance memory cell. Note that initially the threshold switching selector 502 is off. Step 1504 may include providing the Cap Isolation Decode signal to any of the WL decode transistors in FIG. 13A-14B, as examples. The Cap Isolation Decode signal will only weakly turn on the WL decode transistors at this time. However, the read current will be provided to the selected word line. A select voltage may be applied to a selected bit line while driving the read current to the selected word line. In one embodiment, the selected bit line is held at about 0V while a read current of about 15 μA is driven to the selected word line. In one embodiment, the selected bit line is held at about 3.3V while a read current of about −15 μA is driven to the selected word line. Step 1504 may provide capacitive isolation to the selected memory cell from the circuit capacitance of the current generation and delivery circuitry 802.

Sep 1506 includes providing a discharge path in preparation for lowering the resistance of the decode transistor(s).

In an embodiment, the discharge circuitry 806 is enabled. In one embodiment, a capacitor (e.g., C1a, C1b) is connected to a read path by closing S2a or S2b. In one embodiment, a voltage source (e.g., Vstep) is connected to the read path by closing S1a or S21.

Step 1508 includes changing the gate voltage to the decode transistor(s) to a second voltage that lowers the resistance of the decode transistor(s). This second voltage may provide a greater overdrive than the first gate voltage of step 1504. Step 1508 may remove the capacitive isolation. The discharge circuitry 806 remains enabled while the capacitive isolation is removed to prevent a potential snap-back current from the removal of the capacitive isolation from disturbing the state of the memory cell 401.

Step 1510 includes removing the discharge path. In an embodiment, the discharge circuitry 806 is disabled. In an embodiment, the switch (e.g., S1a, S21, S2a, S2b) that was closed in step 1506 is opened in step 1510.

Step 1512 includes sensing the memory cell. The memory cell is thus sensed with the discharge circuitry 806 is disabled and with the capacitive isolation circuitry 804 in the default mode. Recall that in the default mode the one or more transistors that provide for the capacitive isolation have a low resistance (e.g., strongly on). In one embodiment, the sensing is for a Read1 of an SRR. In one embodiment, the sensing is for a Read2 of an SRR after the write to a particular state. In one embodiment, the sensing is for a globally referenced read.

In view of the foregoing, it can be seen that, according to an embodiment, an apparatus comprises an apparatus comprising a cross-point memory structure having first conductive lines, second conductive lines, and memory cells. Each memory cell is at a crosspoint of a first conductive line and a second conductive line. Each memory cell has a programmable resistance memory element in series with a threshold switching selector. The apparatus comprising current generation and delivery circuitry configured to generate a read current. The current generation and delivery circuitry has a circuit capacitance. The apparatus comprises one or more control circuits configured to communicate with the cross-point memory structure and the current generation and delivery circuitry. The one or more control circuits configured to connect the current generation and delivery circuitry to a selected first conductive line in the cross-point memory structure while providing a select voltage to a selected second conductive line to provide the read current to the selected first conductive line. A selected memory cell resides between the selected first conductive line and the selected second conductive line. The one or more control circuits configured to temporarily provide capacitive isolation of the selected first conductive line from the circuit capacitance of the current generation and delivery circuitry while providing the read current to the selected first conductive line. The one or more control circuits configured to provide a discharge path to a node between the current generation and delivery circuitry and the selected first conductive line during a period in which the one or more control circuits remove the capacitive isolation. The one or more control circuits configured to sense the selected memory cell after both the temporary capacitive isolation and the discharge path have been removed.

In a further embodiment, the one or more control circuits are configured to connect a capacitor to the node between the current generation and delivery circuitry and the selected first conductive line to provide the discharge path to the selected first conductive line.

In a further embodiment, the one or more control circuits are configured to provide a voltage step pulse to the node between the current generation and delivery circuitry and the selected first conductive line to provide the discharge path to the selected first conductive line.

In a further embodiment, the step voltage pulse comprises a power supply voltage.

In a further embodiment, the one or more control circuits are configured to: temporarily provide the capacitive isolation for the selected first conductive line from the circuit capacitance while the threshold switching selector of the selected memory cell switches on; and provide the discharge path to the node after the threshold switching selector of the selected memory cell switches on.

In a further embodiment, the programmable resistance memory element comprises a magnetoresistive element.

In a further embodiment, the threshold switching selector comprises an Ovonic Threshold Switch (OTS).

In a further embodiment, the one or more control circuits are configured to apply a first overdrive voltage to a control gate of a decode transistor between the current generation and delivery circuitry and the selected first conductive line to connect the current generation and delivery circuitry to the selected first conductive line. The first overdrive voltage causes the decode transistor to provide the capacitive isolation. The one or more control circuits are configured to change the first overdrive voltage to a second overdrive voltage applied to the control gate of the decode transistor. The second overdrive voltage turns on the decode transistor more strongly than the first overdrive voltage. The selected memory cell is sensed with the decode transistor at the second overdrive voltage. The one or more control circuits are configured to provide the discharge path to the node during a period in which the voltage to the control gate of the decode transistor is changed from the first overdrive voltage to the second overdrive voltage.

In a further embodiment, the one or more control circuits are configured to connect a capacitor to the node between the current generation and delivery circuitry and the selected first conductive line to provide the discharge path to the node during the period in which the voltage to the control gate of the decode transistor is changed from the first overdrive voltage to the second overdrive voltage.

In a further embodiment, the one or more control circuits are configured to provide a voltage step pulse to the node between the current generation and delivery circuitry and the selected first conductive line to provide the discharge path to the selected first conductive line during the period in which the voltage to the control gate of the decode transistor is changed from the first overdrive voltage to the second overdrive voltage.

In a further embodiment, the one or more control circuits are configured to cause a first resistance in a transistor between the current generation and delivery circuitry and the selected first conductive line in the cross-point memory structure to temporarily provide the capacitive isolation of the selected first conductive line from the circuit capacitance while providing the read current to the selected first conductive line. The one or more control circuits are configured to cause a second resistance in the transistor after the threshold switching selector of the selected memory cell switches on to remove the capacitive isolation. The second resistance is lower than the first resistance. The selected memory cell is sensed with the transistor at the second resistance. The one or more control circuits are configured to provide the discharge path to the selected first conductive line during a period in which the resistance of the transistor is lowered from the first resistance to the second resistance.

An embodiment includes a method for reading a programmable resistance memory cell in a cross-bar array. The method comprises generating a read current with current generation and delivery circuitry having a circuit capacitance. The method comprises applying a first overdrive voltage to a control gate of a decode transistor between the current generation and delivery circuitry and a selected first conductive line in the cross-bar array to connect the current generation and delivery circuitry to the selected first conductive line. The first overdrive voltage results in a first resistance of the decode transistor. The method comprises changing the first overdrive voltage to a second overdrive voltage applied to the control gate of the decode transistor. The second overdrive voltage results in a second resistance of the decode transistor that is lower than the first resistance. The method comprises providing a discharge path to the selected first conductive line during a period in which the voltage to the decode transistor is changed from the first overdrive voltage to the second overdrive voltage. The method comprises removing the discharge path to the selected first conductive line after changing the first overdrive voltage to the second overdrive voltage. The method comprises sensing a selected memory cell connected to the selected first conductive line after discharge path has been removed and while the second overdrive voltage is applied to the decode transistor.

An embodiment includes a memory system comprising a cross-point memory structure having first conductive lines, second conductive lines, and memory cells. Each memory cell is at a crosspoint of a first conductive line and a second conductive line. Each memory cell has a programmable resistance memory element in series with a threshold switching selector. The memory system has current generation and delivery circuitry configured to generate a read current. The current generation and delivery circuitry has a circuit capacitance. The memory system has one or more control circuits configured to communicate with the cross-point memory structure and the current generation and delivery circuitry. The one or more control circuits are configured to cause a first resistance in a transistor between the current generation and delivery circuitry and a selected first conductive line in the cross-point memory structure while providing a select voltage to a selected second conductive line to provide the read current through the transistor to the selected first conductive line. A selected memory cell resides between the selected first conductive line and the selected second conductive line. The one or more control circuits are configured to cause a second resistance in the transistor after the threshold switching selector of the selected memory cell switches on, the second resistance is lower than the first resistance. The one or more control circuits are configured to provide a discharge path for the selected first conductive line during a period in which the resistance of the transistor is lowered from the first resistance to the second resistance. The one or more control circuits are configured to remove the discharge path after lowering the resistance of the transistor to the second resistance. The one or more control circuits are configured to sense the selected memory cell after the discharge path has been removed and the transistor has the second resistance.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable tolerance for a given application.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:

a cross-point memory structure having first conductive lines, second conductive lines, and memory cells, each memory cell at a crosspoint of a first conductive line and a second conductive line, each memory cell having a programmable resistance memory element in series with a threshold switching selector;

current generation and delivery circuitry configured to generate a read current, the current generation and delivery circuitry having a circuit capacitance;

capacitive isolation circuitry between the current generation and delivery circuitry and the cross-point memory structure; and one or more control circuits configured to communicate with the cross-point memory structure and the current generation and delivery circuitry, the one or more control circuits configured to:

connect the current generation and delivery circuitry to a selected first conductive line in the cross-point memory structure while providing a select voltage to a selected second conductive line to provide the read current to the selected first conductive line, a selected memory cell resides between the selected first conductive line and the selected second conductive line;

operate the capacitive isolation circuitry to temporarily provide capacitive isolation of the selected first conductive line from the circuit capacitance of the current generation and delivery circuitry while providing the read current to the selected first conductive line;

provide a discharge path to a node between the current generation and delivery circuitry and the selected first conductive line during a period in which the one or more control circuits operate the capacitive isolation circuitry to remove the capacitive isolation; and sense the selected memory cell after both the temporary capacitive isolation and the discharge path have been removed.

2. The apparatus of claim 1, wherein the one or more control circuits are configured to:

connect a capacitor to the node between the current generation and delivery circuitry and the selected first conductive line to provide the discharge path to the selected first conductive line.

3. The apparatus of claim 1, wherein the one or more control circuits are configured to:

provide a voltage step pulse to the node between the current generation and delivery circuitry and the selected first conductive line to provide the discharge path to the selected first conductive line.

4. The apparatus of claim 3, wherein the step voltage pulse comprises a power supply voltage.

5. The apparatus of claim 1, wherein the one or more control circuits are configured to:

temporarily provide the capacitive isolation for the selected first conductive line from the circuit capacitance while the threshold switching selector of the selected memory cell switches on; and provide the discharge path to the node after the threshold switching selector of the selected memory cell switches on.

6. The apparatus of claim 1, wherein the programmable resistance memory element comprises a magnetoresistive element.

7. The apparatus of claim 1, wherein the threshold switching selector comprises an Ovonic Threshold Switch (OTS).

8. The apparatus of claim 1, wherein the capacitive isolation circuitry includes a decode transistor between the current generation and delivery circuitry and the selected first conductive line, the one or more control circuits are configured to:

apply a first overdrive voltage to a control gate of the decode transistor to connect the current generation and delivery circuitry to the selected first conductive line, the first overdrive voltage causes the decode transistor to provide the capacitive isolation;

change the first overdrive voltage to a second overdrive voltage applied to the control gate of the decode transistor, the second overdrive voltage turns on the decode transistor more strongly than the first overdrive voltage, the selected memory cell is sensed with the decode transistor at the second overdrive voltage; and provide the discharge path to the node during a period in which the voltage to the control gate of the decode transistor is changed from the first overdrive voltage to the second overdrive voltage.

9. The apparatus of claim 8, wherein the one or more control circuits are configured to:

connect a capacitor to the node between the current generation and delivery circuitry and the selected first conductive line to provide the discharge path to the node during the period in which the voltage to the control gate of the decode transistor is changed from the first overdrive voltage to the second overdrive voltage.

10. The apparatus of claim 8, wherein the one or more control circuits are configured to:

provide a voltage step pulse to the node between the current generation and delivery circuitry and the selected first conductive line to provide the discharge path to the selected first conductive line during the period in which the voltage to the control gate of the decode transistor is changed from the first overdrive voltage to the second overdrive voltage.

11. The apparatus of claim 1, wherein the capacitive isolation circuitry includes a transistor between the current generation and delivery circuitry and the selected first conductive line the one or more control circuits are configured to:

cause a first resistance in the transistor between the current generation and delivery circuitry and the selected first conductive line in the cross-point memory structure to temporarily provide the capacitive isolation of the selected first conductive line from the circuit capacitance while providing the read current to the selected first conductive line;

cause a second resistance in the transistor after the threshold switching selector of the selected memory cell switches on to remove the capacitive isolation, the second resistance is lower than the first resistance, the selected memory cell is sensed with the transistor at the second resistance; and provide the discharge path to the selected first conductive line during a period in which the resistance of the transistor is lowered from the first resistance to the second resistance.

12. A method for reading a programmable resistance memory cell in a cross-bar array, the method comprising:

generating a read current with current generation and delivery circuitry having a circuit capacitance;

applying a first overdrive voltage to a control gate of a decode transistor between the current generation and delivery circuitry and a selected first conductive line in the cross-bar array to connect the current generation and delivery circuitry to the selected first conductive line, the first overdrive voltage results in a first resistance of the decode transistor;

changing the first overdrive voltage to a second overdrive voltage applied to the control gate of the decode transistor, the second overdrive voltage results in a second resistance of the decode transistor that is lower than the first resistance;

providing a discharge path to the selected first conductive line during a period in which the voltage to the decode transistor is changed from the first overdrive voltage to the second overdrive voltage;

removing the discharge path to the selected first conductive line after changing the first overdrive voltage to the second overdrive voltage; and sensing a selected memory cell connected to the selected first conductive line after discharge path has been removed and while the second overdrive voltage is applied to the decode transistor.

13. The method of claim 12, wherein providing the discharge path to the selected first conductive line during the period in which the voltage to the decode transistor is changed from the first overdrive voltage to the second overdrive voltage comprises:

connecting a capacitor to a read path to provide the discharge path to the selected memory cell.

14. The method of claim 12, wherein providing the discharge path to the selected first conductive line during the period in which the voltage to the decode transistor is changed from the first overdrive voltage to the second overdrive voltage comprises:

providing a voltage step pulse to a read path to provide the discharge path to the selected memory cell.

15. The method of claim 12, wherein:

applying the first overdrive voltage to the control gate of the decode transistor is started prior to a threshold switching selector of the selected memory cell turning on comprises initiating the first overdrive voltage prior to the threshold switching selector turning on; and changing the first overdrive voltage to the second overdrive voltage is performed a period of time after the threshold switching selector turning on.

16. A memory system comprising:

a cross-point memory structure having first conductive lines, second conductive lines, and memory cells, each memory cell at a crosspoint of a first conductive line and a second conductive line, each memory cell having a programmable resistance memory element in series with a threshold switching selector;

current generation and delivery circuitry configured to generate a read current, the current generation and delivery circuitry having a circuit capacitance; and one or more control circuits configured to communicate with the cross-point memory structure and the current generation and delivery circuitry, the one or more control circuits configured to:

cause a first resistance in a transistor between the current generation and delivery circuitry and a selected first conductive line in the cross-point memory structure while providing a select voltage to a selected second conductive line to provide the read current through the transistor to the selected first conductive line, a selected memory cell resides between the selected first conductive line and the selected second conductive line;

cause a second resistance in the transistor after the threshold switching selector of the selected memory cell switches on, the second resistance is lower than the first resistance;

provide a discharge path for the selected first conductive line during a period in which the resistance of the transistor is lowered from the first resistance to the second resistance;

remove the discharge path after lowering the resistance of the transistor to the second resistance; and sense the selected memory cell after the discharge path has been removed and the transistor has the second resistance.

17. The memory system of claim 16, wherein the one or more control circuits are configured to:

connect a capacitor to a read path to provide the discharge path to the selected first conductive line; and remove the capacitor from the read path to remove the discharge path.

18. The memory system of claim 16, wherein the one or more control circuits are configured to:

provide a voltage step pulse to a read path to provide and remove the discharge path to the selected first conductive line.

19. The memory system of claim 16, wherein the programmable resistance memory element comprises an MRAM element.

20. The memory system of claim 16, wherein the threshold switching selector comprises an Ovonic Threshold Switch (OTS).

* * * * *